(12) United States Patent
Katsuno et al.

(10) Patent No.: US 8,338,844 B2
(45) Date of Patent: Dec. 25, 2012

(54) SEMICONDUCTOR LIGHT EMITTING APPARATUS HAVING STACKED REFLECTIVE DIELECTRIC FILMS

(75) Inventors: Hiroshi Katsuno, Tokyo (JP); Yasuo Ohba, Kanagawa-ken (JP); Kei Kaneko, Kanagawa-ken (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/549,048

(22) Filed: Aug. 27, 2009

(65) Prior Publication Data

US 2010/0051995 A1 Mar. 4, 2010

(30) Foreign Application Priority Data

Aug. 28, 2008 (JP) ................................. 2008-220144

(51) Int. Cl.
  *H01L 33/00* (2010.01)
  *H01L 29/40* (2006.01)
  *H01L 21/00* (2006.01)
(52) U.S. Cl. ............ 257/98; 257/99; 257/774; 257/778; 257/E33.056; 257/E33.06; 257/E33.067; 438/26
(58) Field of Classification Search .................. 257/778, 257/98, 99, E33.056, E33.06, E33.067
See application file for complete search history.

(56) References Cited

U.S. PATENT DOCUMENTS

| | | | |
|---|---|---|---|
| 6,281,526 B1 * | 8/2001 | Nitta et al. ................... 257/103 |
| 7,335,916 B2 * | 2/2008 | Kim et al. ...................... 257/70 |
| 2005/0035176 A1 * | 2/2005 | Ozawa ........................ 228/101 |
| 2005/0104080 A1 * | 5/2005 | Ichihara et al. ................. 257/98 |
| 2010/0320488 A1 * | 12/2010 | Horie ............................. 257/91 |

FOREIGN PATENT DOCUMENTS

| JP | 2007-324585 | 12/2007 |
|---|---|---|
| WO | WO 2007/126093 A1 * | 11/2007 |

* cited by examiner

*Primary Examiner* — N Drew Richards
*Assistant Examiner* — Michael Jung
(74) *Attorney, Agent, or Firm* — Oblon, Spivak, McClelland, Maier & Neustadt, L.L.P.

(57) ABSTRACT

A method for manufacturing a semiconductor light emitting apparatus includes causing a semiconductor light emitting device and a mounting member to face each other. The semiconductor light emitting device includes a stacked structure unit including a first semiconductor layer, a second semiconductor layer, and a light emitting layer provided between the first semiconductor layer and the second semiconductor layer, a first electrode provided on a major surface of the stacked structure unit to connect to the first semiconductor layer, a second electrode provided on the major surface of the stacked structure unit to connect to the second semiconductor layer, and a dielectric stacked film provided on the first semiconductor layer and the second semiconductor layer of the major surface not covered by the first electrode and the second electrode, formed of stacked dielectric films having different refractive indexes, and including a protruding portion erected on at least a portion of a rim of at least one of the first and second electrodes. The mounting member includes a connection member connected to at least one of the first and second electrodes. The method further includes causing the connection member to contact and join to the at least one of the first and second electrodes using the protruding portion as a guide.

6 Claims, 17 Drawing Sheets

SEMICONDUCTOR LIGHT EMITTING APPARATUS HAVING STACKED REFLECTIVE DIELECTRIC FILMS

CROSS-REFERENCE TO RELATED APPLICATIONS

This application is based upon and claims the benefit of priority from the prior Japanese Patent Application No. 2008-220144, filed on Aug. 28, 2008; the entire contents of which are incorporated herein by reference.

BACKGROUND OF THE INVENTION

1. Field of the Invention

This invention relates to a method for manufacturing a semiconductor light emitting apparatus and a semiconductor light emitting apparatus.

2. Background Art

In a flip-chip semiconductor light emitting device using a light emitting layer to produce light and emit the light from a substrate side, light extraction efficiency can be improved by improving the reflectance and increasing the surface area of the reflecting region of an electrode formation surface.

For example, in the case where a p-side electrode is used to provide both ohmic characteristics and high-efficiency reflecting characteristics, the reflectance of regions in which electrodes are not formed is low, resulting in a lower light extraction efficiency. Therefore, light extraction efficiencies are being improved by increasing the surface area of the reflecting region by ingenuity such as shortening the distance between the p-side electrode and an n-side electrode.

High mounting precision is necessary during flip-chip mounting of the semiconductor light emitting device in the case where electrode design emphasizes such light extraction efficiency.

On the other hand, mass production of light emitting diodes using semiconductor light emitting devices is necessary to increase cost competitiveness. Therefore, the time to mount a single device normally must not be more than 0.5 seconds, and the mounting precision is extremely low.

JP-A 2007-324585 (Kokai) discusses mounting technology using metal solder for flip-chip mounted semiconductor light emitting devices.

SUMMARY OF THE INVENTION

According to an aspect of the invention, there is provided a method for manufacturing a semiconductor light emitting apparatus, including: causing a semiconductor light emitting device and a mounting member to face each other, the semiconductor light emitting device including: a stacked structure unit including a first semiconductor layer, a second semiconductor layer, and a light emitting layer provided between the first semiconductor layer and the second semiconductor layer; a first electrode provided on a major surface of the stacked structure unit to connect to the first semiconductor layer; a second electrode provided on the major surface of the stacked structure unit to connect to the second semiconductor layer; and a dielectric stacked film provided on the first semiconductor layer and the second semiconductor layer of the major surface not covered by the first electrode and the second electrode, formed of stacked dielectric films having different refractive indexes, and including a protruding portion erected on at least a portion of a rim of at least one of the first and second electrodes, the mounting member including a connection member connected to at least one of the first and second electrodes, and causing the connection member to contact and join to the at least one of the first and second electrodes using the protruding portion as a guide.

According to another aspect of the invention, there is provided a semiconductor light emitting apparatus, including: a semiconductor light emitting device; and a mounting member, the semiconductor light emitting device including: a stacked structure unit including a first semiconductor layer, a second semiconductor layer, and a light emitting layer provided between the first semiconductor layer and the second semiconductor layer; a first electrode provided on a major surface of the stacked structure unit to connect to the first semiconductor layer; a second electrode provided on the major surface of the stacked structure unit to connect to the second semiconductor layer; and a dielectric stacked film provided on the first semiconductor layer and the second semiconductor layer of the major surface not covered by the first electrode and the second electrode, formed of stacked dielectric films having different refractive indexes, and including a protruding portion erected on a rim of at least one of the first and second electrodes, and the mounting member being provided to face the major surface of the semiconductor light emitting device and including a connection member, the connection member welded to the at least one of the first electrode and the second electrode and covering a portion of the protruding portion.

DETAILED DESCRIPTION OF THE INVENTION

Figure 1A:
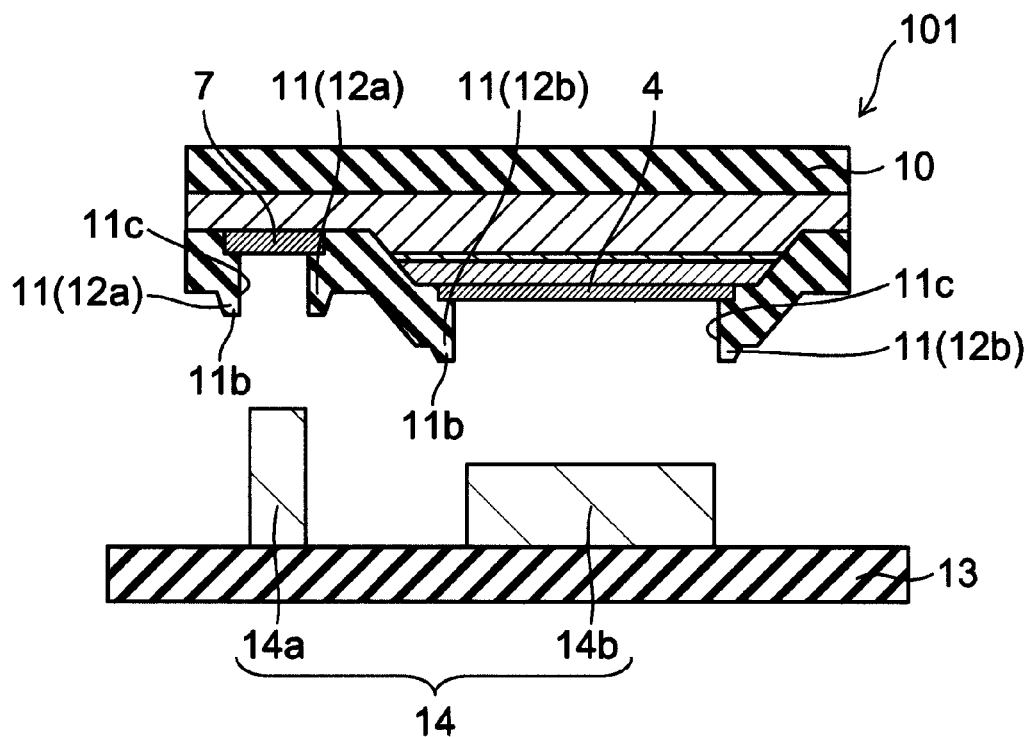
FIGS. 1A and 1B are sequential schematic cross-sectional views illustrating manufacturing processes of a semiconductor light emitting apparatus according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
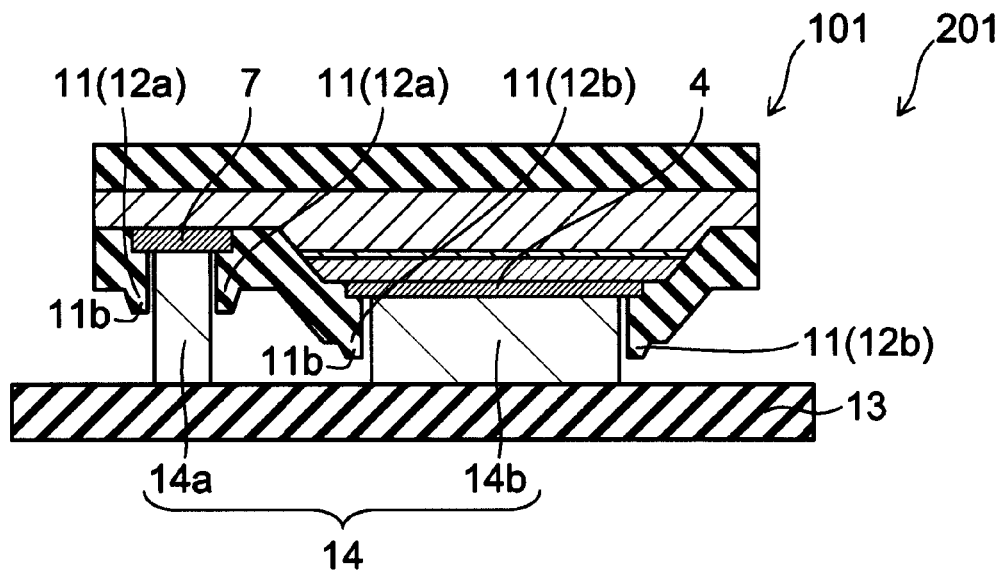

FIGS. 1A and 1B are sequential schematic cross-sectional views illustrating manufacturing processes of a semiconductor light emitting apparatus according to a first embodiment of the invention.

Figure 2A:
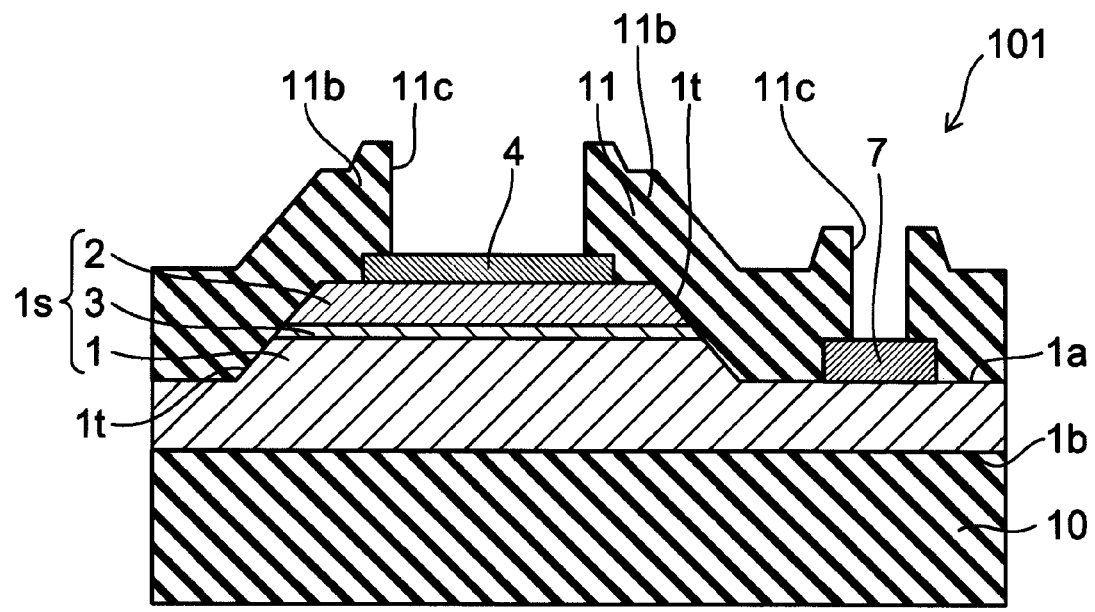
FIGS. 2A and 2B are schematic views illustrating the configuration of a semiconductor light emitting device applicable to the manufacturing processes of the semiconductor light emitting apparatus according to the first embodiment of the invention.
Figure 2B:
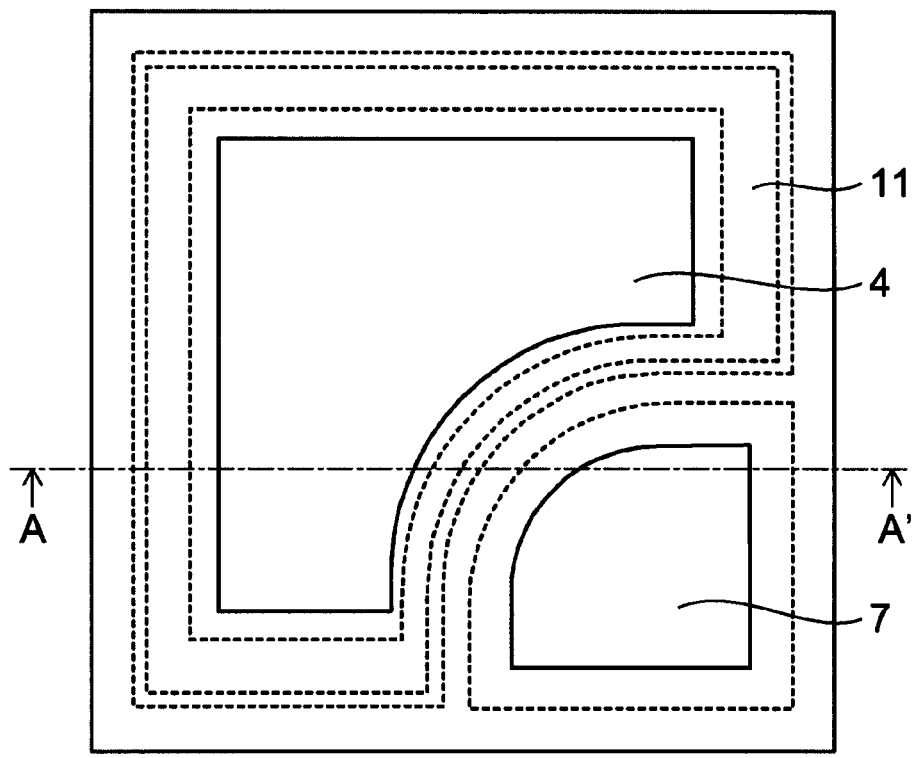

FIGS. 2A and 2B are schematic views illustrating the configuration of a semiconductor light emitting device applicable to the manufacturing processes of the semiconductor light emitting apparatus according to the first embodiment of the invention.

Namely, FIG. 2B is a plan view, and FIG. 2A is a cross-sectional view along line A-A' of FIG. 2B.

Figure 3:
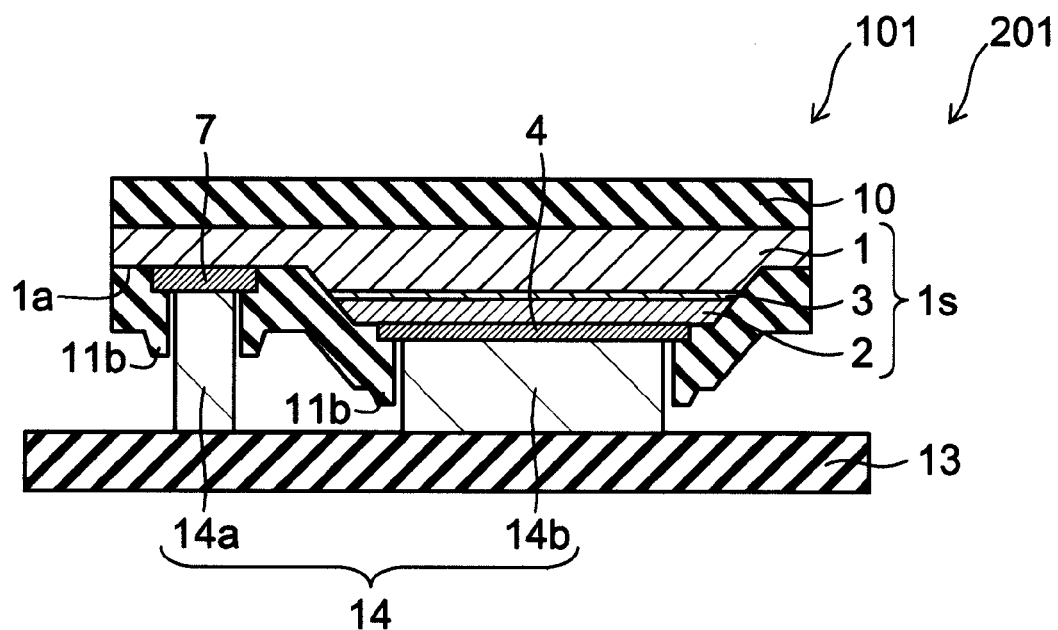
FIG. 3 is a schematic cross-sectional view illustrating the configuration of the semiconductor light emitting apparatus manufactured by the manufacturing processes of the semiconductor light emitting apparatus according to the first embodiment of the invention.

FIG. 3 is a schematic cross-sectional view illustrating the configuration of the semiconductor light emitting apparatus manufactured by the manufacturing processes of the semiconductor light emitting apparatus according to the first embodiment of the invention.

Figure 4:
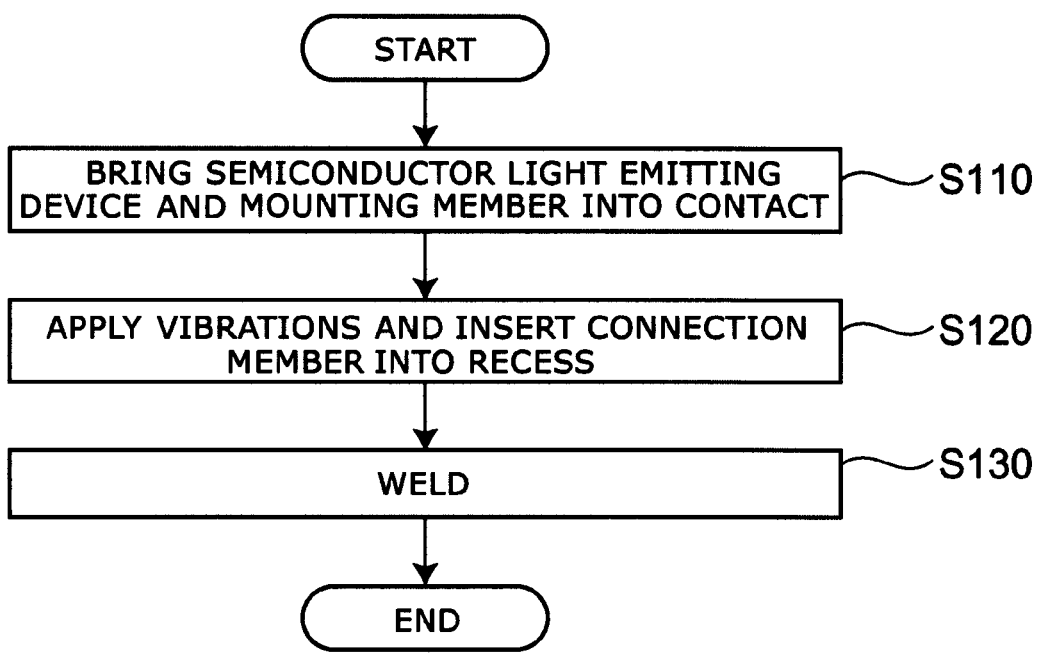
FIG. 4 is a flowchart illustrating the manufacturing processes of the semiconductor light emitting apparatus according to the first embodiment of the t invention.

FIG. 4 is a flowchart illustrating the manufacturing processes of the semiconductor light emitting apparatus according to the first embodiment of the invention.

First, the configuration of a semiconductor light emitting device 101 for which the semiconductor light emitting apparatus of this embodiment is applicable will be described with reference to FIGS. 2A and 2B.

In the semiconductor light emitting device 101 according to the first embodiment of the invention illustrated in FIG. 2A, an n-type semiconductor layer (first semiconductor layer) 1, a light emitting layer 3, and a p-type semiconductor layer (second semiconductor layer) 2 are stacked in this order to form a stacked structure unit 1s on a substrate 10 made of, for example, sapphire.

A p-side electrode (second electrode) 4, an n-side electrode (first electrode) 7, and a dielectric stacked film 11 are provided on the same major surface 1a of the stacked structure unit 1s.

That is, the p-side electrode 4 is provided on the p-type semiconductor layer 2. As described below, the p-side electrode 4 may include a second metal film (second p-side electrode film) 4b (not illustrated) forming a high-efficiency reflecting film and a first metal film (first p-side electrode film) 4a (not illustrated) made of metal having not necessarily highly efficient reflecting characteristics.

A portion of the p-type semiconductor layer 2 and the light emitting layer 3 is removed by, for example, etching. The n-side electrode 7 is provided on the exposed n-type semiconductor layer 1.

Although the n-side electrode 7 occupies one corner of the square semiconductor light emitting device 101 in the specific example illustrated in FIG. 2B, the configuration of the n-side electrode 7 is not limited thereto.

The dielectric stacked film 11 is provided on the n-type semiconductor layer 1 and the p-type semiconductor layer 2 of the major surface 1a not covered by the n-side electrode 7 and the p-side electrode 4. The dielectric stacked film 11 includes stacked dielectric films having different refractive indexes. As described below, the dielectric stacked film 11 functions as a guide during the assembly when manufacturing a semiconductor light emitting apparatus using the semiconductor light emitting device 101 in addition to the function of reflecting light emitted by the light emitting layer 3.

It is sufficient that the dielectric stacked film 11 recited above is provided on at least a portion of a rim of at least one of the n-side electrode 7 and the p-side electrode 4. In other words, the dielectric stacked film 11 may be provided to completely enclose the rim of at least one of the n-side electrode 7 and the p-side electrode, or the dielectric stacked film 11 may be provided on a portion of the rim of at least one of the n-side electrode 7 and the p-side electrode 4.

A portion of the dielectric stacked film 11 may be provided on at least a portion of the n-side electrode 7 and the p-side electrode 4.

The dielectric stacked film 11 is provided in the semiconductor light emitting device 101. Therefore, a difference in levels from the dielectric stacked film 11 to the n-side electrode 7 and the p-side electrode 4 is provided. Restated, the dielectric stacked film 11 in the semiconductor light emitting device 101 includes protruding portions 11b protruding further than the n-side electrode 7 and the p-side electrode 4.

The protruding portions 11b are erected on at least a portion of the rim of at least one of the n-side electrode 7 and the p-side electrode 4.

Recesses 11c are defined by the protruding portions 11b between the protruding portions 11b.

A semiconductor light emitting apparatus including such a semiconductor light emitting device 101 will now be described with reference to FIG. 3. FIG. 3 illustrates the semiconductor light emitting device 101 vertically inverted from the illustration of FIG. 2A.

As illustrated in FIG. 3, a semiconductor light emitting apparatus 201 manufactured by the method for manufacturing the semiconductor light emitting apparatus according to this embodiment includes the semiconductor light emitting device 101 recited above and a mounting member 13 on which the semiconductor light emitting device 101 may be mounted. The mounting member 13 includes, for example, a submount, mounting substrate, etc., on which the semiconductor light emitting device may be mounted.

The mounting member 13 and the semiconductor light emitting device 101 are joined by connection members 14 connected to the electrodes (the n-side electrode 7 and the p-side electrode 4) of the semiconductor light emitting device 101. The connection members 14 are conductive and may include a material which can be welded to metal. For example, a material which is conductive, is a solid at room temperature, and changes to a liquid state at a high temperature, e.g., solder, may be used.

The connection members 14 include an n-side connection member 14a which connects to the n-side electrode 7 of the semiconductor light emitting device 101 and a p-side connection member 14b which connects to the p-side electrode 4 of the semiconductor light emitting device 101. The connection members 14 (the n-side connection member 14a and the p-side connection member 14b) may be provided on not-illustrated electrodes provided on the mounting member 13. The n-side connection member 14a and the p-side connection member 14b protrude further than the major surface of the mounting member 13.

Thereby, the semiconductor light emitting device 101 and the mounting member 13 can be fixed while electrically connecting the not-illustrated electrodes provided on the mounting member 13 to the electrodes (the n-side electrode 7 and the p-side electrode 4) of the semiconductor light emitting device 101.

In the method for manufacturing the semiconductor light emitting apparatus according to this embodiment that manufactures a semiconductor light emitting apparatus 201 including such a configuration, the semiconductor light emitting device 101 and the mounting member 13 are caused to face each other, and the connection members 14 are caused to contact and join to the n-side electrode 7 and the p-side electrode 4 using the protruding portions 11b of the dielectric stacked film 11 as guides as illustrated in FIGS. 1A and 1B.

The protruding portions 11b are provided on at least a portion of the rim of at least one of the n-side electrode 7 and the p-side electrode 7. Accordingly, in the manufacturing method recited above, the connection members 14 are caused to contact and join to the n-side electrode 7 and the p-side electrode 4 (i.e., the at least one of the same) having the protruding portions 11b recited above provided thereon using the protruding portions 11b as guides.

The above description will now be described in greater detail.

First, as illustrated in FIG. 1A, for example, the semiconductor light emitting device 101 is held by a vacuum chuck using a collet, etc., moved above the mounting member 13, and positioned substantially aligned with the mounting member 13.

The mounting member 13 and the semiconductor light emitting device 101 are caused to contact each other in the substantially aligned state.

In other words, the semiconductor light emitting device 101 and the mounting member 13 are brought into contact such that the recess 11c and the connection member 14 are in a substantially aligned state as illustrated in FIG. 4 (step S110).

At this time, the dielectric stacked film 11 provided in the semiconductor light emitting device 101 protrudes further than the n-side electrode 7 and the p-side electrode 4, and the protruding portion 11b of each of the n-side electrode 7 and the p-side electrode 4 forms an n-side guide portion 12a and a p-side guide portion 12b, respectively. In this design, the n-side guide portion 12a and the p-side guide portion 12b are caused to contact and mutually align with the n-side connection member 14a and the p-side connection member 14b of the mounting member 13. The n-side connection member 14a and the p-side connection member 14b are inserted and fit into interiors of the n-side guide portion 12a and the p-side guide portion 12b.

In other words, the planar configurations of the n-side connection member 14a and the p-side connection member 14b are smaller than the configurations of the recesses of the n-side guide portion 12a and the p-side guide portion 12b to enter into the interiors of the n-side guide portion 12a and the p-side guide portion 12b, respectively.

In other words, the configurations of the connection members 14 in the plane parallel to the major surface 1a are smaller than the configurations of the recesses 11c in the plane parallel to the major surface 1a.

The heights of the n-side connection member 14a and the p-side connection member 14b are set higher than the differences in levels of the n-side guide portion 12a and the p-side guide portion 12b (the difference in levels between the n-side guide portion 12a and the n-side electrode 7 and the difference in levels between the p-side guide portion 12b and the p-side electrode 4), respectively. In other words, the heights of the connection members 14 are higher than the heights (the difference in levels between the n-side guide portion 12a and the n-side electrode 7 and the difference in levels between the p-side guide portion 12b and the p-side electrode 4) of the protruding portions 11b.

As illustrated in FIG. 1B, vibrations (e.g., ultrasonic vibrations) may be applied to the semiconductor light emitting device 101 via, for example, a collet; the semiconductor light emitting device 101 moves around instantaneously in a range of several tens of microns; the n-side connection member 14a and the p-side connection member 14b are inserted and fit into the interiors of the n-side guide portion 12a and the p-side guide portion 12b; and the semiconductor light emitting device 101 may be fixed in this position. It is sufficient that the vibrations recited above are applied to at least one of the semiconductor light emitting device 101 and the mounting member 13. Although there is no particular limitation in regard to the frequency of the vibrations recited above, ultrasonic vibrations of at least 20 kHz are desirable.

In other words, vibrations are applied to at least one of the semiconductor light emitting device 101 and the mounting member 13 in a contacting state, the connection members 14 are inserted into the recesses 11c surrounded by the protruding portions 11b, and the connection members 14 are brought into contact with the at least one of the n-side electrode 7 and the p-side electrode 7 as illustrated in FIG. 4 (step S120).

Thereafter, for example, the temperature is increased to at least the melting point of the connection member 14, and the connection members 14 are welded to the p-side electrode 4 and the n-side electrode 7, respectively.

In other words, the connection members 14 are welded to the at least one of the n-side electrode 7 and the p-side electrode 4 after the fitting (step S130).

Thereby, it is possible to manufacture the semiconductor light emitting apparatus 201 by performing high-precision and high-speed assembly of the semiconductor light emitting device 101 having a high light extraction efficiency and the mounting member 13. Such a manufacturing method improves the precision and increases the light extraction efficiency of the semiconductor light emitting apparatus 201.

The heating in step S130 recited above may be performed according to the properties of the connection members 14. For example, in the case where the connection members 14 are solder, the connection members 14 melt due to the heat and are welded to at least one of the n-side electrode 7 and the p-side electrode 4.

Step S130 recited above may be implemented according to the properties of the connection members 14 and the electrical characteristics and/or reliability required for the semiconductor light emitting apparatus.

In other words, step S130 recited above may be omitted in the case where the connection member 14 is electrically connected to at least one of the n-side electrode 7 and the p-side electrode 4 with the practically required contact resistance and reliability after the fitting in step S120 recited above. Alternatively, step S130 may be omitted in the case where, for example, the semiconductor light emitting device 101 and the mounting member 13 are housed in an interior of another holder, etc., and the connection member 14 is electrically connected to at least one of the n-side electrode 7 and the p-side electrode 4 by a force from the holder with the practically required contact resistance and reliability after step S120.

In the method for manufacturing the semiconductor light emitting apparatus according to this embodiment, the possible range of the alignment of the semiconductor light emitting device 101 can be adjusted by the force from the collet to press (or bring into contact) the semiconductor light emitting device 101, the frequency and/or strength of the vibrations, optimization of the material qualities of the collet itself to amplify the vibration amplitude, etc.

According to the method for manufacturing the semiconductor light emitting apparatus according to this embodiment, it is unnecessary to use gold bumps and the like formed by a ball bonder, and alignment is possible with high precision. Therefore, the surface area of the n-side electrode 7 can be made smaller than those of conventional structures. Thereby, the surface area of the p-side electrode 4 can be increased, the light emitting region and the reflecting region can be increased, and the light output can be increased.

The positioning guides (the n-side guide portion 12a and the p-side guide portion 12b) corresponding to the electrodes (the n-side electrode 4 and the p-side electrode 7) can be formed with high precision on the substrate 10 forming the semiconductor light emitting device 101. Therefore, the design degrees of freedom of the electrodes can be improved, the light extraction efficiency can be increased, and improvement of the light output can be expected.

Further, by forming the dielectric stacked film 11 to cover the ends of the p-side electrode 4 and the n-side electrode 7, the connection members (the solder) 14 can be prevented from contacting the semiconductor layers, and the occurrence of stress and voids between the connection members (the solder) 14 and the semiconductor layers can be prevented.

Thus, by using the dielectric stacked film 11 of the semiconductor light emitting device 101, the majority of the major surface of the semiconductor layers where the electrodes are formed can have a reflective structure. Also, by using the dielectric stacked film 11 as a positioning guide, mounting with high alignment precision is easily possible. Thereby, the degrees of freedom of the electrode design increase; improvement of the light extraction efficiency due to the increase of the reflecting region and cost reductions due to high-speed mounting can be expected; and a light source can be provided having little shifting of the light emission points in the semiconductor light emitting apparatus.

The semiconductor light emitting device 101 applicable to the method for manufacturing the semiconductor light emitting apparatus of this embodiment will now be described in detail.

First, a specific example of the stacked structure of the semiconductor layer formed on the substrate 10 will be described.

The semiconductor light emitting device 101 according to this embodiment includes, for example, a nitride semiconductor formed on the substrate 10 made of sapphire.

Namely, for example, metal organic chemical vapor deposition may be used to form, on the substrate 10 having a surface made of a sapphire c-plane, a sequentially stacked structure including a high carbon-concentration first AlN buffer layer (having a carbon concentration of $3\times10^{18}$ cm$^{-3}$ to $5\times10^{20}$ cm$^{-3}$) with a thickness of 3 nm to 20 nm, a high-purity second AlN buffer layer (having a carbon concentration of $1\times10^{16}$ cm$^{-3}$ to $3\times10^{18}$ cm$^{-3}$) with a thickness of 2 μm, a non-doped GaN buffer layer with a thickness of 3 μm, a Si-doped n-type GaN contact layer (having a Si concentration of $1\times10^{18}$ cm$^{-3}$ to $5\times10^{18}$ cm$^{-3}$) with a thickness of 4 μm, a Si-doped n-type $Al_{0.10}Ga_{0.90}N$ cladding layer (having a Si concentration of $1\times10^{18}$ cm$^{-3}$) with a thickness 0.02 μm, a light emitting layer having a multiple quantum well structure of three alternately stacked periods of a Si-doped n-type $Al_{0.11}Ga_{0.89}N$ barrier layer (having a Si concentration of 1.1 to $1.5\times10^{19}$ cm$^{-3}$) and a GaInN light emitting layer (having a wavelength of 380 nm) with a thickness 0.075 μm, a final $Al_{0.11}Ga_{0.89}N$ barrier layer of a multiple quantum well (having a Si concentration of 1.1 to $1.5\times10^{19}$ cm$^{-3}$) with a thickness 0.01 μm, a Si-doped n-type $Al_{0.11}Ga_{0.89}N$ layer (having a Si concentration of 0.8 to $1.0\times10^{19}$ cm$^{-3}$) with a thickness of 0.01 μm, a non-doped $Al_{0.11}Ga_{0.89}N$ spacer layer with a thickness of 0.02 μm, a Mg-doped p-type $Al_{0.28}Ga_{0.72}N$ cladding layer (having a Mg concentration of $1\times10^{19}$ cm$^{-3}$) with a thickness of 0.02 μm, a Mg-doped p-type GaN contact layer (having a Mg concentration of $1\times10^{19}$ cm$^{-3}$) with a thickness of 0.1 μm, and a high-concentration Mg-doped p-type GaN contact layer (having a Mg concentration of $2\times10^{20}$ cm$^{-3}$) with a thickness of 0.02 μm.

Here, the n-type semiconductor layer 1 illustrated in FIG. 2A may include the high carbon-concentration first AlN buffer layer, the high-purity second AlN buffer layer, the non-doped GaN buffer layer, the Si-doped n-type GaN contact layer, and the Si-doped n-type $Al_{0.10}Ga_{0.90}N$ cladding layer recited above.

The light emitting layer 3 illustrated in FIG. 2A may include the final $Al_{0.11}Ga_{0.89}N$ barrier layer of the multiple quantum well and the light emitting layer having the multiple quantum well structure formed of three alternately stacked periods of the Si-doped n-type $Al_{0.11}Ga_{0.89}N$ barrier layer and the GaInN light emitting layer (having a wavelength of 380 nm) recited above.

The p-type semiconductor layer 2 illustrated in FIG. 2A may include the Mg-doped p-type $Al_{0.28}Ga_{0.72}N$ cladding layer, the Mg-doped p-type GaN contact layer, and the high-purity Mg-doped p-type GaN contact layer recited above.

Increasing the Mg concentration of the Mg-doped p-type GaN contact layer to about $1\times10^{20}$ $cm^{-3}$ improves the ohmic contact characteristics with the p-side electrode. However, a semiconductor light emitting diode differs from a semiconductor laser diode in that there is a risk of deterioration of characteristics due to Mg diffusion due to the short distance between the contact layer and the light emitting layer 4. Therefore, by utilizing the increased contact surface area between the p-side electrode 4 and the contact layer and the lower current density during operation, the Mg concentration can be kept at about $1\times10^{19}$ $cm^{-3}$ without greatly harming the electrical characteristics. Thereby, Mg diffusion can be prevented, and light emission characteristics can be improved.

The high carbon-concentration first AlN buffer layer acts to relieve effects of crystal types different from the substrate and particularly reduce screw dislocations.

The surface of the high-purity second AlN buffer layer flattens at the atomic level. Although defects of the non-doped GaN buffer layer grown thereon can be thereby reduced, to this end, it is favorable that the film thickness of the high-purity second AlN buffer layer is thicker than 1 μm. To prevent warp due to strain, it is desirable that the thickness of the high-purity second AlN buffer layer is not greater than 4 μm. The high-purity second AlN buffer layer is not limited to AlN, $Al_xGa_{1-x}N$ ($0.8 \leq x \leq 1$) may be used, and the warp of the wafer can be compensated.

The non-doped GaN buffer layer performs the role of reducing defects by performing three-dimensional island growth on the high-purity second AlN buffer layer. It is necessary for the average film thickness of the non-doped GaN buffer layer to be not less than 2 μm to allow flattening of the growth surface. A total film thickness of the non-doped GaN buffer layer of 4 to 10 μm is appropriate from the aspect of reproducibility and reduction of warp.

By utilizing such buffer layers, defects can be reduced to about one-tenth of those in conventional low-temperature growth AlN buffer layers. Such technology enables high-concentration Si doping of the n-type GaN contact layer and the manufacture of highly efficient semiconductor light emitting devices emitting light even in the ultraviolet band. Absorption of light in the buffer layers also can be suppressed by reducing the crystal defects of the buffer layers.

The formation of the electrodes on the semiconductor layers of the semiconductor light emitting device 101 will now be described.

The following description assumes the case where the p-side electrode 4 of the semiconductor light emitting device 101 includes a first metal film (first p-side electrode film) 4a made of metal having not necessarily high-efficiency reflecting characteristics and a second metal film (second p-side electrode film) 4b forming a high-efficiency reflecting film provided between the first metal film (the first p-side electrode film) 4a and the p-type semiconductor layer 2.

Figure 5A:
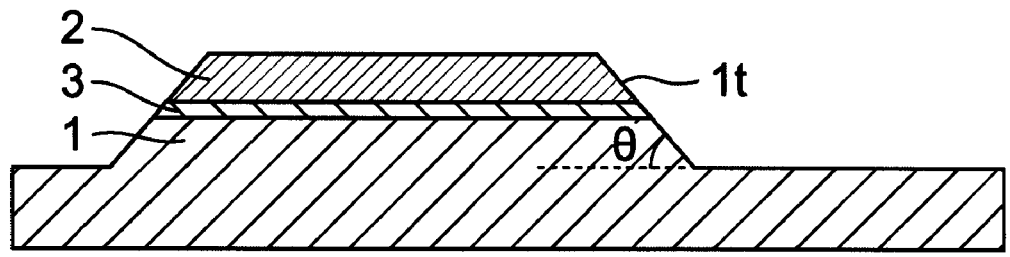
FIGS. 5A to 5C are sequential schematic cross-sectional views illustrating manufacturing processes of the semiconductor light emitting device applicable to the method for manufacturing the semiconductor light emitting apparatus according to the first embodiment of the invention.
Figure 5B:
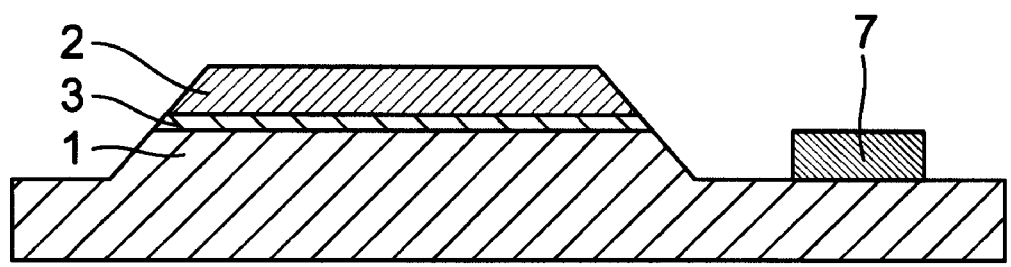
Figure 5C:
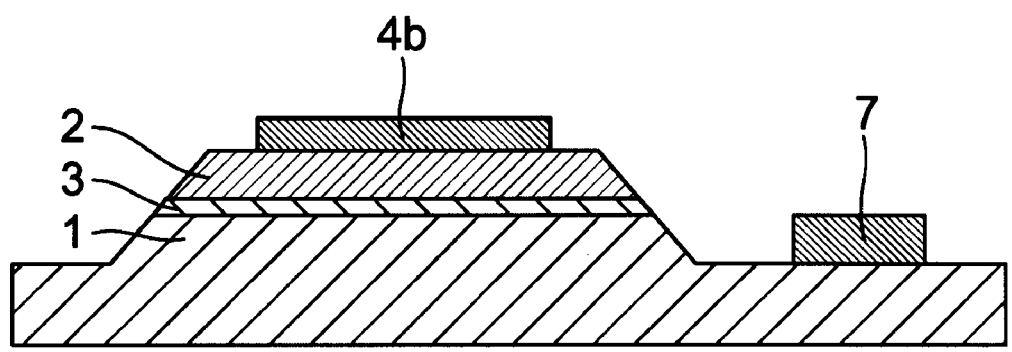

FIGS. 5A to 5C are sequential schematic cross-sectional views illustrating manufacturing processes of the semiconductor light emitting device applicable to the method for manufacturing the semiconductor light emitting apparatus according to the first embodiment of the invention.

Figure 6A:
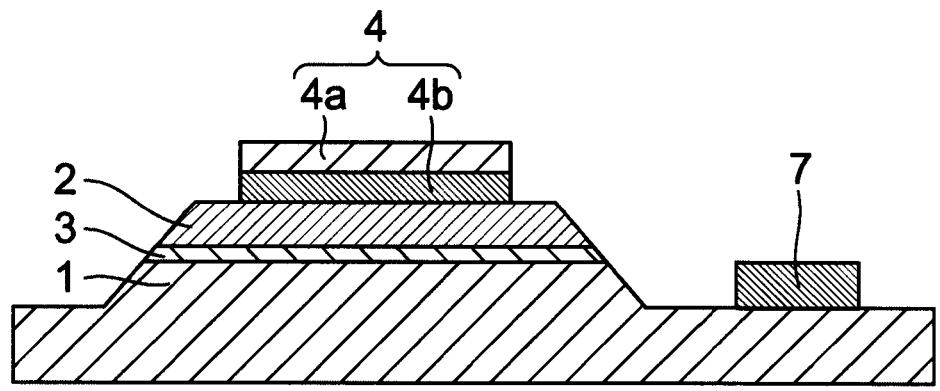
FIGS. 6A to 6C are sequential schematic cross-sectional views continuing from FIG. 5C.
Figure 6B:
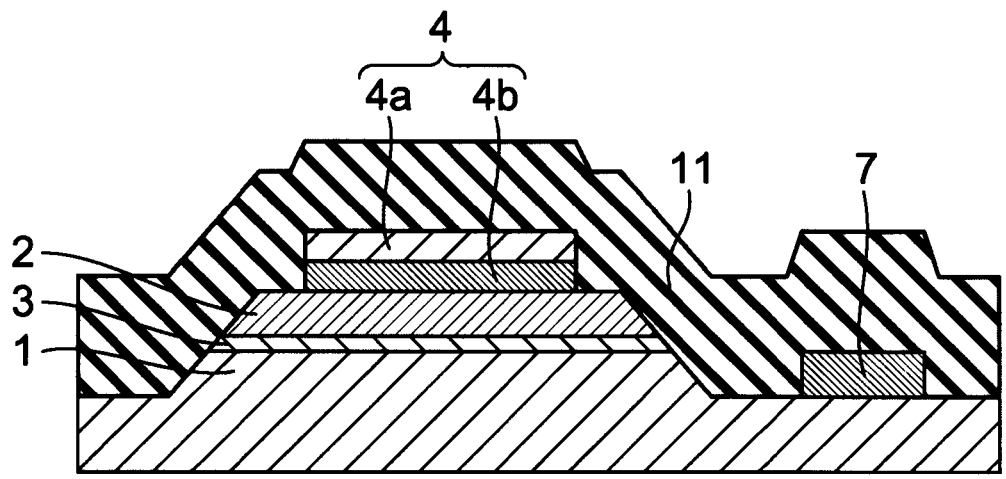
Figure 6C:
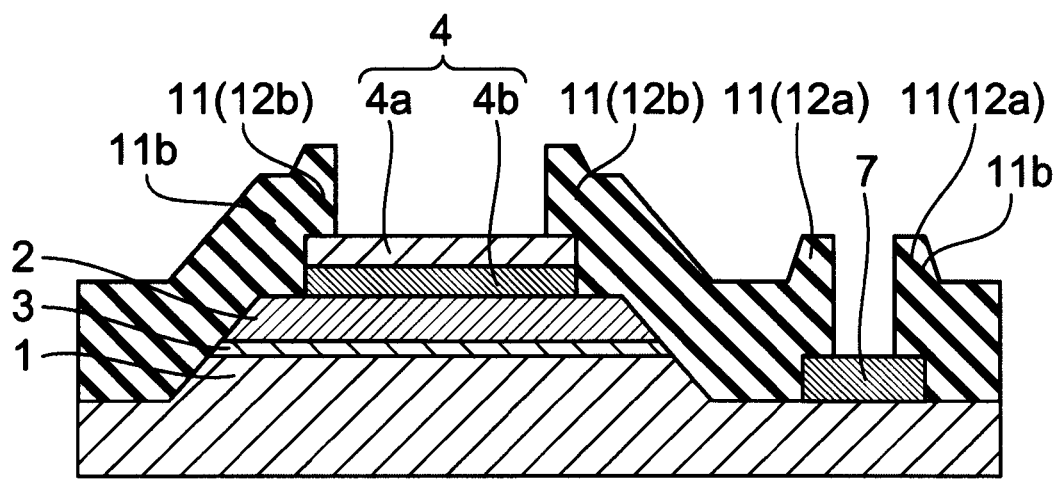

FIGS. 6A to 6C are sequential schematic cross-sectional views continuing from FIG. 5C.

First, as illustrated in FIG. 5A, dry etching using a mask is performed on a region of a portion of the p-type semiconductor layer 2 to remove the p-type semiconductor layer 2 and the light emitting layer 3 until the n-type contact layer is exposed at the surface. At this time, the difference in levels between the p-type semiconductor layer 2 and the n-type semiconductor layer 1 can be patterned into a tapered configuration having any angle by optimizing the mask configuration and the dry etching conditions. Restated, a tapered portion it can be provided on the semiconductor layers. Here, the angle between the layer surfaces of the semiconductor layers and the inclined face of the tapered portion it is referred to as "taper angle θ (°)." That is, the smaller the taper angle θ, the more the inclination of the tapered portion it forms a moderate inclined face; and a taper angle θ of 90 degrees has a side face in which the stepped region of the n-type semiconductor layer 1 and the p-type semiconductor layer 2 has a stairstep configuration.

The n-side electrode 7 having ohmic characteristics is then formed as illustrated in FIG. 5B. Namely, a not-illustrated patterned lift-off resist is formed on the exposed n-type contact layer, a vacuum vapor deposition apparatus is used to form, for example; a Ti/Al/Ni/Au film having a film thickness of 500 nm as the n-side electrode 7 for the ohmic contact region; and after lift-off, sintering is performed at 550° C. in a nitrogen atmosphere.

Continuing as illustrated in FIG. 5C, the p-side electrode 4 is formed by forming a not-illustrated patterned lift-off resist on the p-type contact layer; using a vacuum vapor deposition apparatus to form, for example, a Ag film with a film thickness of 200 nm as the second p-side electrode film 4b; and after lift-off, performing sintering at 350° C. in a nitrogen atmosphere.

Then, as illustrated in FIG. 6A, a not-illustrated patterned lift-off resist is formed on the semiconductor layers, and a Pt/Au film, for example, having a film thickness of 500 nm is formed as the first p-side electrode film 4a on the region in which the Ag film was formed. Thereby, the p-side electrode 4 is formed.

Continuing as illustrated in FIG. 6B, a vacuum vapor deposition apparatus is used to form, for example, five pairs combining a $SiO_2$ film and a $TiO_2$ film for a total of ten layers on the semiconductor layers.

Then, as illustrated in FIG. 6C, a not-illustrated patterned resist is formed thereupon and ammonium fluoride processing is performed to remove the dielectrics recited above to expose the p-side electrode 4 and the n-side electrode 7 to form the dielectric stacked film 11. The dielectrics recited above may be removed by a dry etching process by using a patterned resist as a mask.

Thus, by forming the dielectric stacked film 11, the dielectric stacked film 11 protrudes further than the n-side electrode 7 and the p-side electrode 4, and the protruding portions 11b provided on at least a portion of the rims of each of the n-side electrode 7 and the p-side electrode 4 form the n-side guide portion 12a and the p-side guide portion 12b.

Continuing, individual light emitting devices are formed by cleavage or cutting by a diamond blade, etc. Thus, the semiconductor light emitting device 101 illustrated in FIGS. 2A and 2B is formed.

Thereafter, as described in regard to FIGS. 1A and 1B, the semiconductor light emitting device 101 is mounted on the mounting member 13 to fabricate the semiconductor light emitting apparatus 201.

The semiconductor light emitting device 101 will now be described further.

As described above, the dielectric stacked film 11 may be formed using, for example, five pairs combining the stacked films of the first dielectric layer (e.g., $SiO_2$) and the second dielectric layer (e.g., $TiO_2$) as dielectrics having at least two types with different refractive indexes, that is, a stacked film made of a total of, for example, ten layers of dielectric layers. In such a case, the film thicknesses of each of the first dielectric layer and the second dielectric layer may be set to a thickness of $\lambda/(4n)$, where n is the refractive index of each of the first dielectric layer and the second dielectric layer and $\lambda$ is the light emission wavelength of the light emitting layer 3.

In other words, the dielectric stacked film 11 includes multiple first dielectric layers having a first refractive index alternately stacked with multiple second dielectric layers having a second refractive index different from the first refractive index, the thickness of each of the first dielectric layers being substantially $\lambda/(4n_1)$ and the thickness of each of the second dielectric layers being substantially $\lambda/(4n_2)$, where $n_1$ is the first refractive index, $n_2$ is the second refractive index, and $\lambda$ is the light emission wavelength of the light emitting layer 3.

In the dielectric stacked film 11, a higher refractive index ratio of the combined dielectrics and a greater number of combined layers (pairs) having different refractive indexes result in a higher reflectance and a wider margin with respect to film thickness and/or wavelength.

Figure 7A:
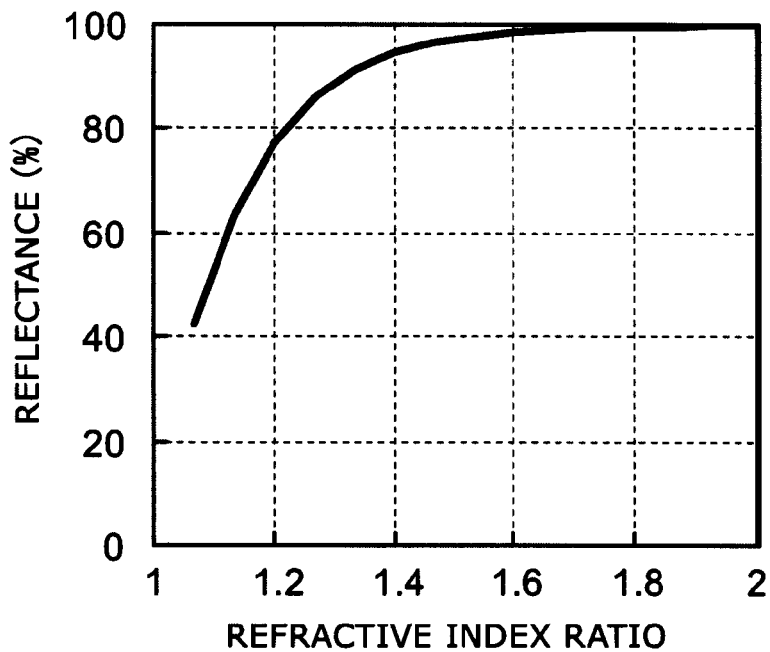
FIGS. 7A and 7B are graphs illustrating characteristics of the semiconductor light emitting device for which the method for manufacturing the semiconductor light emitting apparatus according to the first embodiment of the invention is applicable.
Figure 7B:
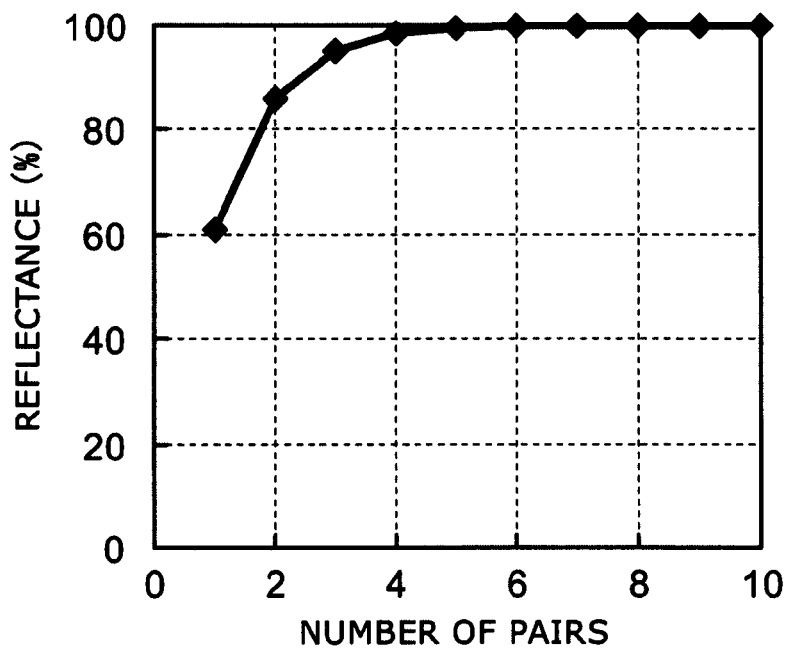

FIGS. 7A and 7B are graphs illustrating characteristics of the semiconductor light emitting device to which the method for manufacturing the semiconductor light emitting apparatus according to the first embodiment of the invention is applicable.

Namely, FIGS. 7A and 7B illustrate simulation results of the reflectance of light emitted by GaN and perpendicularly incident on the dielectric stacked film 11. FIG. 7A illustrates the dependency of the reflectance on the refractive index ratio. FIG. 7B illustrates the dependency of the reflectance on the number of pairs. The refractive index ratio of the dielectrics of the dielectric stacked film 11 combining two types is plotted on the horizontal axis of FIG. 7A. The number of pairs of the dielectrics of the dielectric stacked film 11 combining two types is plotted on the horizontal axis of FIG. 7B. The reflectance is plotted on the vertical axes of FIGS. 7A and 7B.

In these simulations, parameters are changed using the properties of the materials of the dielectric stacked film 11 of the semiconductor light emitting device 101 described above.

For both the refractive index ratio and the number of pairs illustrated in FIGS. 7A and 7B, values of the reflectance near 100% can be obtained by appropriately selecting the conditions.

For example, as illustrated in FIG. 7A, it is desirable to use a refractive index ratio of not less than 1.4 to obtain a reflectance of 95% or higher.

As illustrated in FIG. 7B, it is desirable to use a number of pairs of not less than 3 to obtain a reflectance of 95% or higher.

The more the angle of the light from the GaN incident on the dielectric stacked film 11 inclines from the perpendicular, the more the reflectance increases. Total reflection is obtained at a threshold angle.

Selecting design conditions from such properties can provide a dielectric stacked film 11 that functions as a reflecting film having better performance than a metal reflecting film. By utilizing such a dielectric stacked film 11, improvement of the light extraction efficiency can be expected. The design reflectance of the dielectric stacked film 11 of the semiconductor light emitting device 101 of this specific example is 99.7%.

The emitted light incident on the semiconductor layer cross sections disposed on either side of the light emitting layer 3 is affected by the film thickness in the direction normal to the dielectric stacked film 11 formed on the semiconductor layer cross sections. Therefore, unless the taper angle is 0°, the light is affected in a direction shifted such that the dielectric stacked film 11 is thinner than the design film thickness. The smaller the taper angle, the more the dielectric stacked film of the semiconductor layer cross sections functions as designed.

Figure 8:
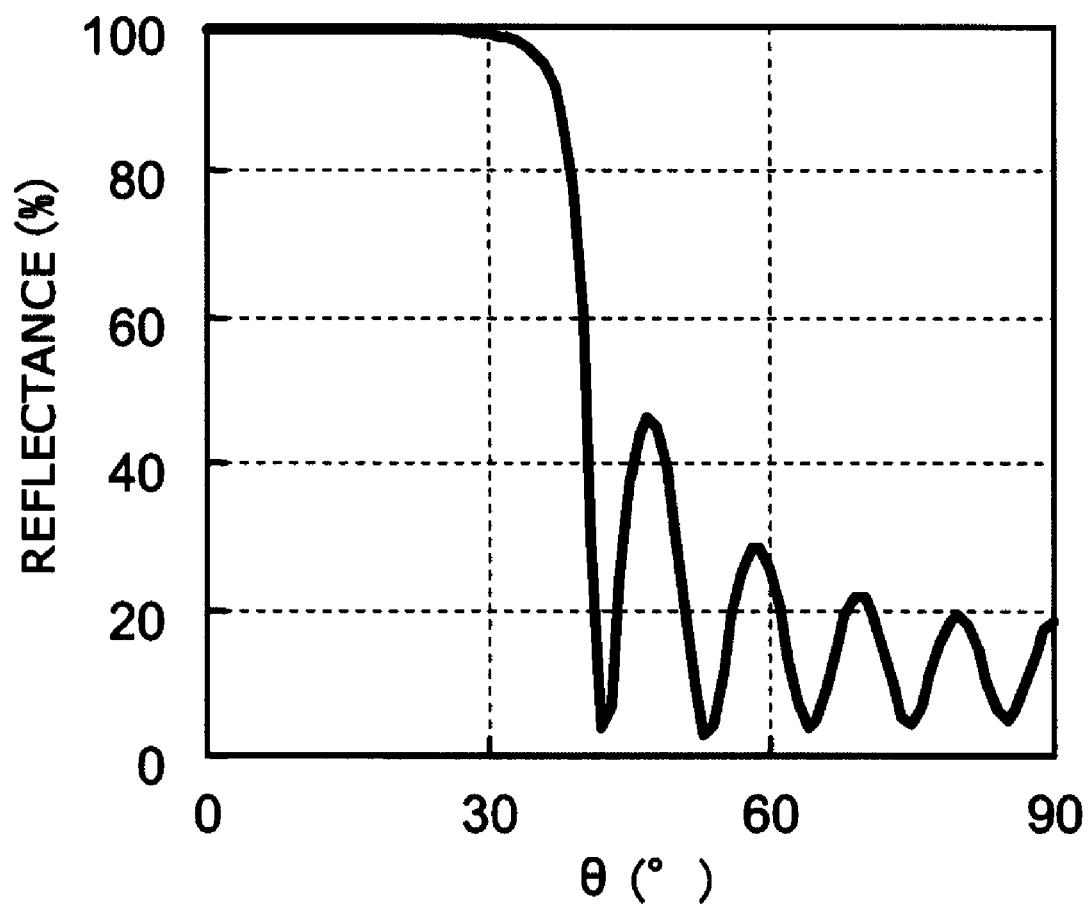
FIG. 8 is a graph illustrating the characteristic of the semiconductor light emitting device for which the method for manufacturing the semiconductor light emitting apparatus according to the first embodiment of the invention is applicable.

FIG. 8 is a graph illustrating the characteristic of the semiconductor light emitting device to which the method for manufacturing the semiconductor light emitting apparatus according to the first embodiment of the invention is applicable.

Namely, FIG. 8 illustrates the calculation results of the relationship between the taper angle and the reflectance of the dielectric stacked film 11. The taper angle is plotted on the horizontal axis, and the reflectance of the dielectric stacked film 11 is plotted on the vertical axis. FIG. 8 illustrates the calculation results using the design conditions described above in regard to the semiconductor light emitting device 101.

As illustrated in FIG. 8, although high reflecting characteristics are obtained in the case where the taper angle θ is about 40 degrees or smaller, the film thickness of the dielectric stacked film 11 is too thin when the taper angle θ is larger than 40 degrees. Therefore, the high reflecting characteristics are not obtained as designed.

The margin for high reflecting characteristics with respect to the taper angle is wider for a larger refractive index ratio of the two types of stacked dielectrics.

Providing the tapered portion it can prevent separation of the dielectric stacked film 11 due to the different levels of the semiconductor layer cross sections disposed on either side of the light emitting layer 3. The tapered portion it functions as a region that changes the angle of emitted light repeatedly reflected inside the semiconductor layers without being extracted. Therefore, the extraction efficiency is improved.

The taper angle θ of the tapered portion it may be appropriately established based on the device surface area and light emission characteristics of the semiconductor light emitting device, the patterning precision, and the like.

The dielectric stacked film 11 may include an oxide, nitride, oxynitride, or the like including at least one of silicon (Si), aluminum (Al), zirconium (Zr), titanium (Ti), niobium (Nb), tantalum (Ta), magnesium (Mg), hafnium (Hf), cerium (Ce), zinc (Zn), or the like. It is favorable that the total film thickness of the stacked dielectric films is not less than 50 nm to ensure insulative properties and not more than 1,000 nm to suppress cracks in the dielectric films.

Increasing the film thickness of the dielectric stacked film 11 as much as possible improves the performance as a positioning guide. Therefore, it is more favorable that the film thickness of the dielectric stacked film 11 is 1,000 nm to 10,000 nm.

To reduce stress between different types of materials due to heat released during device operation, it is favorable that the first layer of the dielectric stacked film 11 on the semiconductor layer side is a material having a linear coefficient of thermal expansion near to those of the semiconductor layers. For example, in the case where the semiconductor layers are GaN, it is favorable to use, for example, SiN as the first layer of the dielectric stacked film 11 on the semiconductor layer side.

Even when the total film thickness of the dielectric stacked film 11 is increased, stacking different types of dielectrics can relieve the stress in the interior. Therefore, compared to a single layer, damage such as cracks do not occur easily; stress on the semiconductor layers can also be relieved; and therefore the performance as the positioning guide improves and the reliability also improves.

In particular, stacking dielectrics under tensile stress and compressive stress promotes stress-relieving effects.

The dielectric stacked film 11 forming the positioning guides is provided around the connection members 14 and therefore can prevent excessive spreading of the connection members (the solder) during the heating of the mounting process. Thereby, the design degrees of freedom of the surface area, film thickness, etc., of the connection members (the solder) 14 increase; the degrees of freedom of the wettability with respect to the electrodes increase; and rapid mounting is possible.

The semiconductor light emitting device to which the method for manufacturing the semiconductor light emitting apparatus of this embodiment is applicable is made of at least the semiconductor layers including the n-type semiconductor layer, the p-type semiconductor layer, and the light emitting layer disposed therebetween. Although the materials of the semiconductor layers are not particularly limited, a gallium nitride compound semiconductor such as, for example, $Al_xGa_{1-x-y}In_yN$ ($x \geq 0$, $y \geq 0$, and $x+y \leq 1$) may be used. Although the methods for forming such semiconductor layers are not particularly limited, technology such as, for example, metal organic chemical vapor deposition, molecular beam epitaxy, and the like may be used.

Although the substrate material of the semiconductor light emitting device to which the method for manufacturing the semiconductor light emitting apparatus of this embodiment is applicable is not particularly limited, general substrates such as sapphire, SiC, GaN, GaAs, and Si may be used. The substrate may ultimately be removed.

As described above, the p-side electrode 4 may be formed of the second p-side electrode film 4b including at least silver or silver alloy and the first p-side electrode film 4a made of metal not including at least silver or silver alloy. The material of the second p-side electrode film 4b may be a single layer of silver, or may be an alloy layer including metal other than silver and aluminum.

Although there is a trend for the reflection efficiencies of normal metal single-layer films in the visible light band to decline as the wavelengths become shorter in the ultraviolet band of 400 nm and below, silver has high reflecting efficiency characteristics for light in the ultraviolet band of 370 nm to 400 nm. Therefore, in the case of a semiconductor light emitting device emitting ultraviolet light including a second p-side electrode film 4b of silver or silver alloy, it is desirable that the component ratio of silver of the second p-side electrode film 4b on the semiconductor interface side is high. It is favorable that the film thickness of the second p-side electrode film 4b is not less than 100 nm to ensure the light reflection efficiency.

In the case where silver or silver alloy is used in the second p-side electrode film 4b, the risk of insulation defects and breakdown voltage defects due to migration from the silver or the silver alloy decreases as the distance between the second p-side electrode film 4b and the n-side electrode 7 increases. The light extraction efficiency increases as the p-side electrode 4 facing the n-side electrode 7 proximal to the center of the device is formed up to the end of the p-type contact layer as much as the process conditions such as lithography precision permit. When considering the current path from the second p-side electrode film 4b to the n-side electrode 7, there is a trend for the current to concentrate in the region having the shortest distance between the second p-side electrode film 4b and the n-side electrode 7. Therefore, it is favorable to design the region having the shortest distance between the second p-side electrode film 4b and the n-side electrode 7 facing each other to be as long as possible to relieve the electric field concentration.

When viewed as a plane, the longer the length of the region where the second p-side electrode film 4b and the n-side electrode 7 face each other, the longer the current path from the second p-side electrode film 4b to the n-side electrode 7. Therefore, the electric field concentration is relieved and deterioration of the second p-side electrode film 4b is suppressed. The surface area and configuration of the second p-side electrode film 4b and the distance between the second p-side electrode film 4b and the n-side electrode 7 may be appropriately decided considering such effects.

The first p-side electrode film 4a is formed of metal not including silver and electrically contacts the second p-side electrode film 4b. The material of the first p-side electrode film 4a is not particularly limited and may include a single-layer or multi-layer metal film, a metal alloy layer, a single-layer or multi-layer conductive oxide film, or a combination thereof. The film thickness of the first p-side electrode film 4a is not particularly limited, and may be selected, for example, between 100 nm to 1,000 nm.

The material of the n-side electrode 7 is not particularly limited. A conductive single-layer or multi-layer film providing an ohmic electrode for an n-type semiconductor may be used. The film thickness of the n-side electrode 7 is not particularly limited, and may be between 5 nm and 1,000 nm.

Other pads may be provided on the p-side electrode 4 and the n-side electrode 7. The film thickness of the pads is not particularly limited, and may be, for example, between 1,000 nm and 10,000 nm. Forming the pads can improve wettability during welding with the connection members (e.g., the solder) 14 and reduce the risk of excessive alloying reactions between the electrodes and the connection members (e.g., the solder) 14.

Using a crystal on a monocrystalline AlN buffer layer can reduce crystal defects to realize high luminous efficiency even in wavelength bands shorter than 400 nm where efficiency normally declines.

In the case where an amorphous or polycrystalline AlN layer is provided to relieve differences in crystal types on the sapphire substrate, the buffer layer itself forms a light absorbing body. Therefore, the light extraction efficiency of the light emitting device declines undesirably. Conversely, by forming the n-type semiconductor layer 1, the light emitting layer 3, and the p-type semiconductor layer 2 on the substrate 10 made of sapphire via the high carbon concentration monocrystalline AlN buffer layer and the high-purity monocrystalline AlN buffer layer, the buffer layers do not easily form light absorbing bodies, and crystal defects can be drastically reduced. Thereby, the light absorbing bodies in the crystal can be drastically reduced. In such a case, it is possible for the emitted light to repeatedly be reflected many times inside the crystal, resulting in better effects from increasing the reflecting region of the electrode formation surface. Due to such effects, improvement of the light emission intensity can be expected.

Figure 9A:
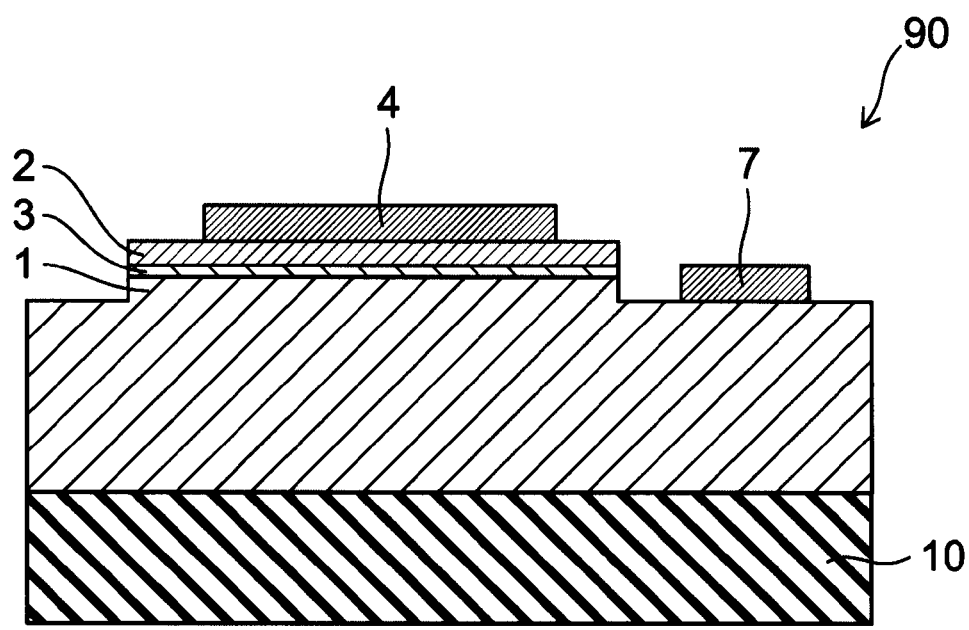
FIGS. 9A and 9B are schematic cross-sectional views illustrating the structure of a semiconductor light emitting device of a comparative example.
Figure 9B:
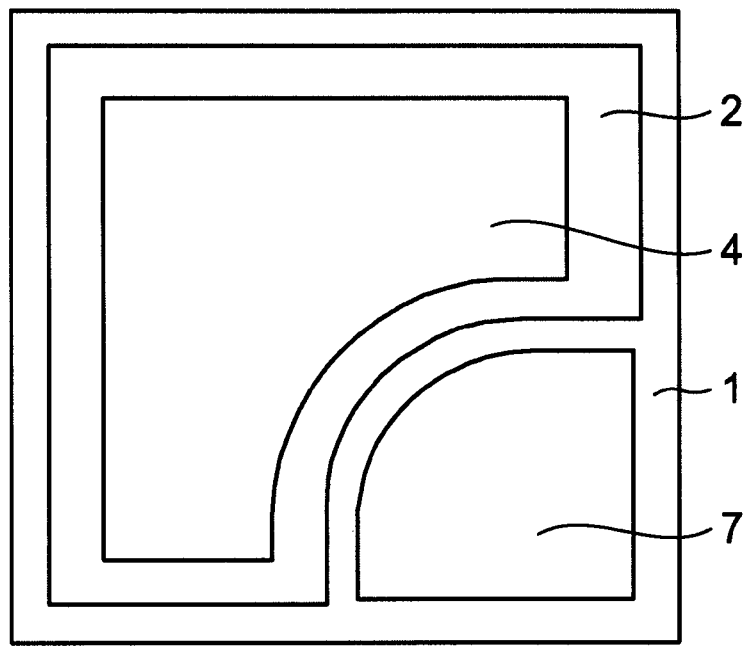

FIGS. 9A and 9B are schematic cross-sectional views illustrating the structure of a semiconductor light emitting device of a comparative example.

The dielectric stacked film 11 is not provided in a semiconductor light emitting device 90 of the comparative example illustrated in FIGS. 9A and 9B. In other words, SiO$_2$ of 400 nm, for example, is formed as a not-illustrated single layer dielectric film instead of the dielectric stacked film 11. Therefore, no differences in levels to the n-side electrode 7 and to the p-side electrode 4 are provided, and no protruding portions forming guide portions are provided.

The electrodes of the semiconductor light emitting device 90 having such a configuration are formed as follows.

First, to form the n-side electrode 7, a patterned lift-off resist is formed on the exposed n-type contact layer; a vacuum vapor deposition apparatus is used to form the n-side electrode 7 having a film thickness of 500 nm made of, for example, Ti/Al/Ni/Au as an ohmic contact region; and sintering is performed at 550° C. in a nitrogen atmosphere.

To form the p-side electrode 4, a patterned lift-off resist is formed on the semiconductor layers; a vacuum vapor deposition apparatus is used to form a Ag film having a film thickness of 200 nm as the second p-side electrode film 4b on the p-type contact layer; and after lift-off, sintering is performed at 350° C. in a nitrogen atmosphere. A similarly patterned lift-off resist is formed on the semiconductor layers, and a Pt/Au film having a film thickness of 500 nm of the first p-side electrode film 4a is formed to cover the region in which the Ag film of the second p-side electrode film 4b is formed.

Continuing, individual light emitting devices are formed by cleavage or cutting by a diamond blade, etc. Thus, the semiconductor light emitting device 90 of the comparative example is fabricated.

The method for mounting the semiconductor light emitting device 90 having such a configuration on the mounting member 13 is described below.

First, a process that mounts the semiconductor light emitting device 90 on the mounting member 13 uses a collet or the like to move the semiconductor light emitting device 90 above the mounting member 13. After aligning the connection members (the solder) 14 on the mounting member 13 with the electrodes, the semiconductor light emitting device 90 is pressed onto the mounting member 13. Then, the temperature of the mounting member is increased to at least the melting point of the connection members (the solder) 14, and the connection members (the solder) 14 are welded to the p-side electrode 4 and the n-side electrode 7, respectively.

In this comparative example, the relative positions of the semiconductor light emitting device 90 and the mounting member 13 are determined by the alignment precision of, for example, a motor that moves the collet. Therefore, the mounting precision is poor. Also, in the case where the speed of moving the device is increased to increase the takt time, the mounting precision gets worse further. To accommodate the poor mounting precision, it is necessary to improve the alignment margin by making the electrodes of the semiconductor light emitting device 90 mutually distal, enlarging the surface area of the n-side electrode 7, etc. As a result, the degrees of freedom of the electrode design decrease, and it is not always possible to select the optimal electrode structure in regard to the light extraction efficiency and the light output.

Conversely, according to this embodiment, the dielectric stacked film 11 is utilized as a positioning guide to easily provide a high mounting precision. Therefore, the degrees of freedom of the electrode design increase. Simultaneously, the dielectric stacked film 11 can be used as a high-efficiency reflecting film. Due to such effects, the light extraction efficiency and the light output can be improved.

Thus, the method for manufacturing the semiconductor light emitting apparatus according to this embodiment can perform high-precision and high-speed assembly of a semiconductor light emitting apparatus having high light extraction efficiency.

Figure 10:
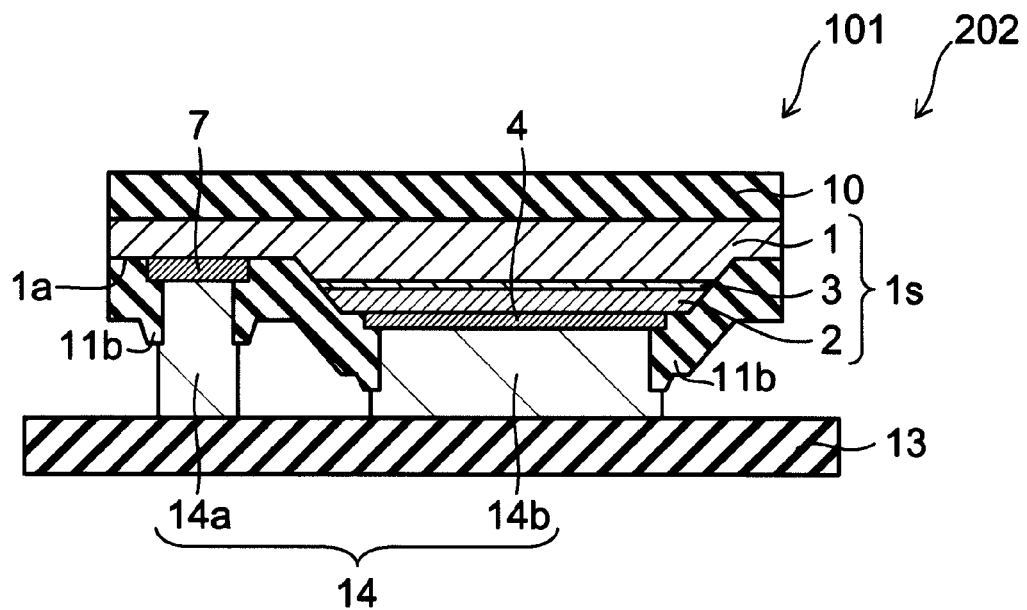
FIG. 10 is a schematic cross-sectional view illustrating the configuration of another semiconductor light emitting apparatus manufactured by the manufacturing processes of the semiconductor light emitting apparatus according to the first embodiment of the invention.

FIG. 10 is a schematic cross-sectional view illustrating the configuration of another semiconductor light emitting apparatus manufactured by the manufacturing processes of the semiconductor light emitting apparatus according to the first embodiment of the invention.

In a semiconductor light emitting apparatus 202 illustrated in FIG. 10, the connection members 14 (the n-side connection member 14a and the p-side connection member 14b) cover a portion of the dielectric stacked film 11.

In other words, the semiconductor light emitting apparatus 202 according to this embodiment includes the semiconductor light emitting device 101 including the stacked structure unit 1s including the n-type semiconductor layer (first semiconductor layer) 1, the p-type semiconductor layer (second semiconductor layer) 2, and the light emitting layer 3 provided between the first semiconductor layer and the second semiconductor layer, the n-side electrode (first electrode) 7 provided on the major surface 1a of the stacked structure unit 1s to connect to the first semiconductor layer, the p-side electrode (second electrode) 4 provided on the major surface 1a of the stacked structure unit 1s to connect to the second semiconductor layer 2, and the dielectric stacked film 11 provided on the first semiconductor layer and the second semiconductor layer of the major surface 1a not covered by the first electrode and the second electrode, formed of multiple stacked dielectric films having different refractive indexes, and including the protruding portion 11b erected on at least a portion of a rim of at least one of the first and second electrodes; and the mounting member 13 provided to face the major surface 1a of the semiconductor light emitting device 101 and including the connection member 14, the connection member 14 welded to the at least one of the first electrode and the second electrode and covering a portion of the protruding portion 11b.

Thus, the connection member 14 (e.g., solder), as shown in FIG. 10, covers a portion of the protruding portion 11b of the dielectric stacked film 11 and thereby prevents, for example, moisture and the like from entering from the interface between the dielectric stacked film 11 and the connection member 14, reaching the n-side electrode 7 and/or the p-side electrode 4, and causing deterioration of the electrodes.

To manufacture the semiconductor light emitting apparatus 202, the welding step S130 of the method for manufacturing the semiconductor light emitting apparatus according to this embodiment illustrated in FIG. 4 includes covering a portion of the protruding portion 11b of the dielectric stacked film 11 with the connection member 14.

At this time, it is necessary that the connection member 14 fixes the semiconductor light emitting device 101 and the mounting member 13 using a pattern having high precision to prevent electrical shorts between the n-side electrode 7 and the p-side electrode 4.

As in the method for manufacturing the semiconductor light emitting apparatus according to this embodiment, the semiconductor light emitting device 101 and the mounting member 13 are assembled by using the protruding portion 11b formed of the dielectric stacked film 11 as a guide, that is, fitting the connection member 14 into the recess 11c defined by the protruding portion 11b. The assembly precision is thereby increased. Therefore, the precision of the configuration of the connection member 14 is high after assembling and fixing the semiconductor light emitting device 101 and the mounting member 13. Thereby, the connection member 14 can cover a portion of the dielectric stacked film 11 with high precision.

In other words, the low assembly precision of the comparative example in which the dielectric stacked film 11 is not provided unfortunately results in electrical shorts between the n-side electrode 7 and the p-side electrode 4 in the case of an excessive amount of the connection member 14. In the case of a scant amount of the connection member 14, deterioration of the electrodes cannot be prevented.

Further, in the manufacturing method of the comparative example in which the dielectric stacked film 11 is provided but not used as a guide during assembly, the assembly precision is low. Therefore, in the case of an excessive amount of the connection member 14, the connection member 14 flows and is disposed on portions on the dielectric stacked film 11 other than the regions to be covered, unfortunately resulting in electrical shorts between the n-side electrode 7 and the p-side electrode 4. On the other hand, in the case of a scant amount of the connection member 14, the connection member 14 cannot cover the prescribed region of the dielectric stacked film 11, and the effect of preventing the deterioration of the electrodes described above cannot be obtained. Furthermore, in the case where the precision is low and the amount of the connection member 14 is small, the connection member 14 cannot be sufficiently filled into the interior of the recess 11c defined by the dielectric stacked film 11, a gap occurs, the deterioration of the electrodes cannot be prevented, and the reliability is poor.

Conversely, according to the method for manufacturing the semiconductor light emitting apparatus according to this embodiment as described above, the dielectric stacked film 11 is used as a positioning guide during assembly. Therefore, the precision is high, and the connection member 14 can cover a portion of the dielectric stacked film 11 from above to provide the prescribed configuration and good precision. Thereby, a semiconductor light emitting apparatus having high reliability can be realized. In the semiconductor light emitting apparatus 202 according to this embodiment, the connection member 14 covers a portion of the dielectric stacked film 11 from above with the prescribed configuration and good precision. Therefore, the reliability is high.

Figure 11:
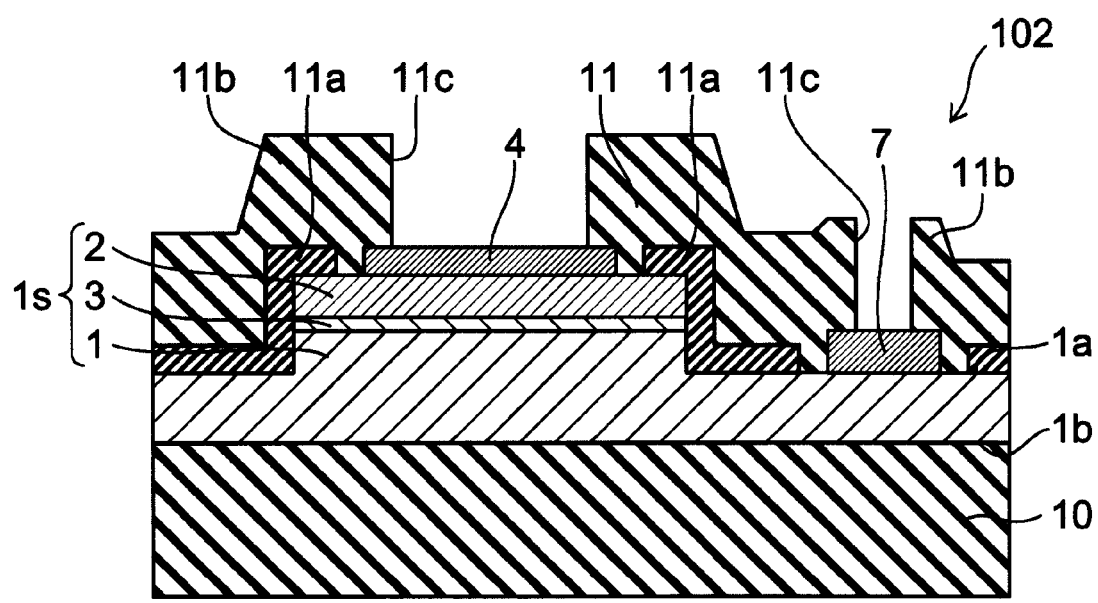
FIG. 11 is a schematic view illustrating the configuration of another semiconductor light emitting device applicable to the manufacturing processes of the semiconductor light emitting apparatus according to the first embodiment of the invention.

FIG. 11 is a schematic view illustrating the configuration of another semiconductor light emitting device applicable to the manufacturing processes of the semiconductor light emitting apparatus according to the first embodiment of the invention.

Figure 12A:
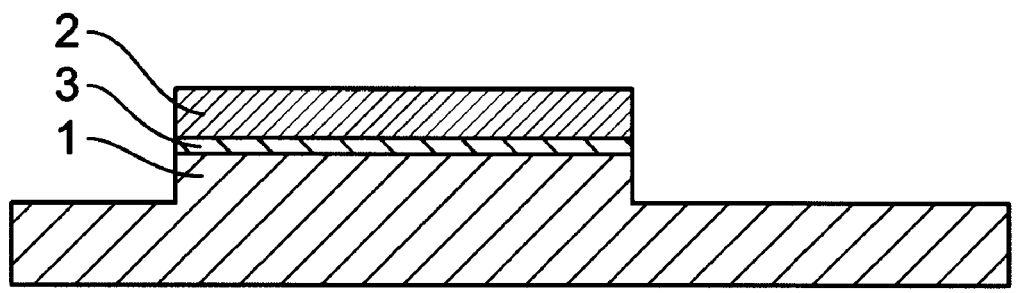
FIGS. 12A to 12C are sequential schematic cross-sectional views illustrating manufacturing processes of another semiconductor light emitting device applicable to the method for manufacturing the semiconductor light emitting apparatus according to the first embodiment of the invention.
Figure 12B:
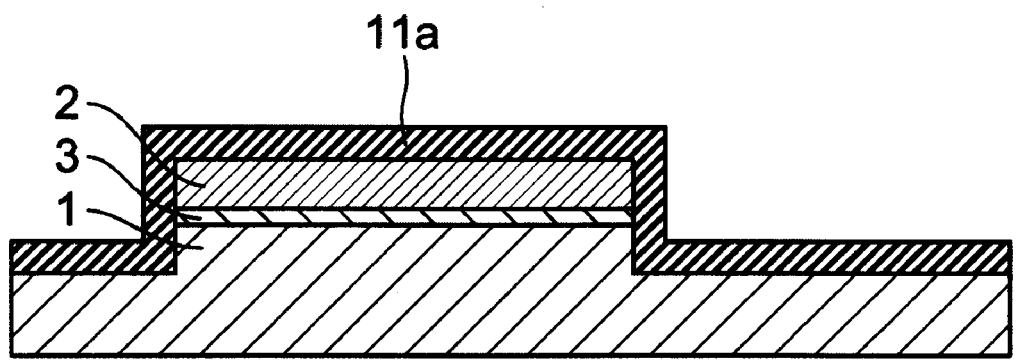
Figure 12C:
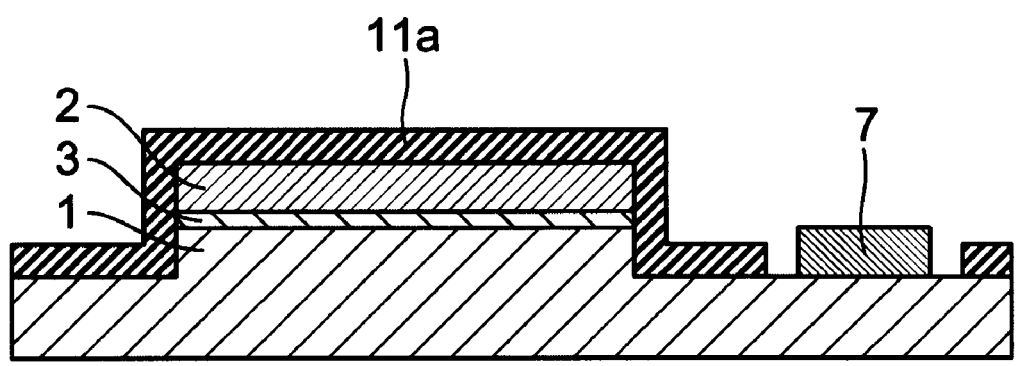

FIGS. 12A to 12C are sequential schematic cross-sectional views illustrating manufacturing processes of another semiconductor light emitting device applicable to the method for manufacturing the semiconductor light emitting apparatus according to the first embodiment of the invention.

Figure 13A:
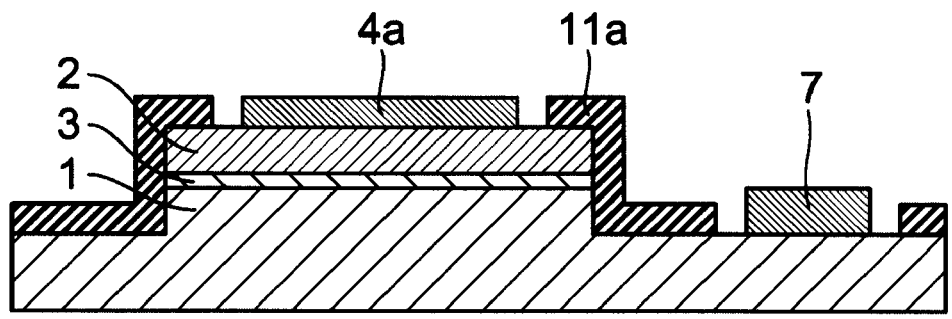
FIGS. 13A to 13C are sequential schematic cross-sectional views continuing from FIG. 12C.
Figure 13B:
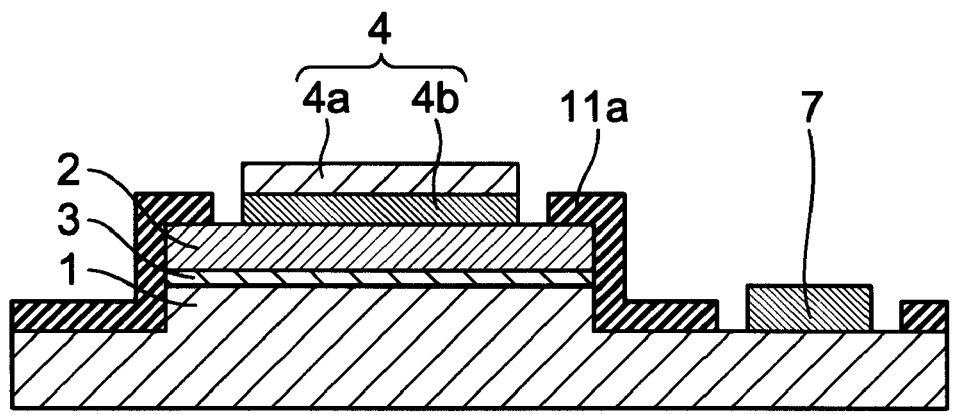
Figure 13C:
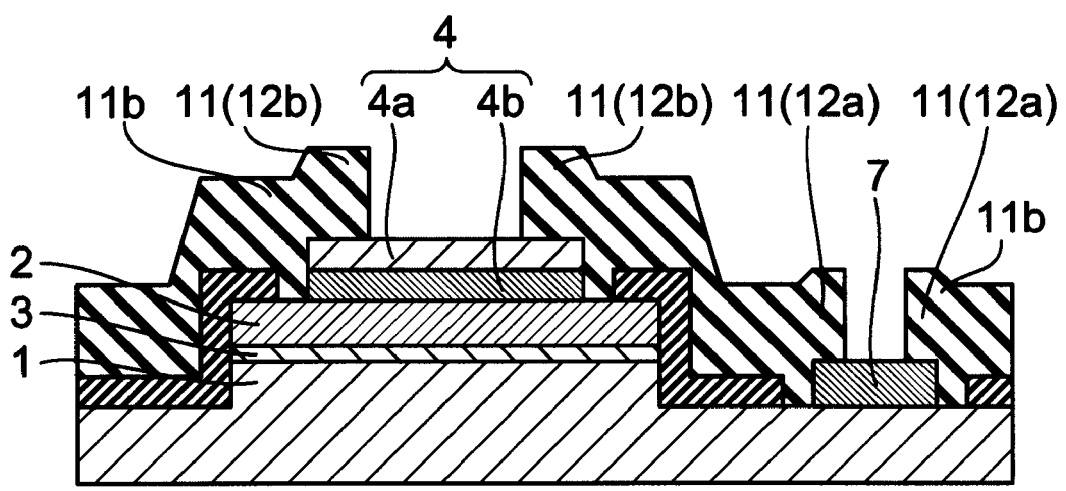

FIGS. 13A to 13C are sequential schematic cross-sectional views continuing from FIG. 12C.

In another semiconductor light emitting device 102 applicable to the method for manufacturing the semiconductor light emitting apparatus according to this embodiment illustrated in FIG. 11, a dielectric film 11a is provided between the dielectric stacked film 11 and the n-type semiconductor layer 1 and between the dielectric stacked film 11 and the p-type semiconductor layer 2. The dielectric film 11a has a better ability than the dielectric stacked film 11 to cover differences in levels. Thereby, even in the case where the semiconductor layer cross sections disposed on either side of the light emitting layer 3 are perpendicular (have a taper angle θ of 90°), the cross section thereof can be covered well by the dielectric film 11a. Otherwise, the semiconductor light emitting device 102 is similar to the semiconductor light emitting device 101 described above, and a description is omitted.

Although details are omitted in FIG. 11, the p-side electrode 4 includes the first p-side electrode film 4a and the second p-side electrode film 4b provided between the first p-side electrode film 4a and the p-type semiconductor layer 2.

Such a semiconductor light emitting device 102 is fabricated as follows.

First, as illustrated in FIG. 12A, dry etching using a mask is performed on a region of a portion of the p-type semiconductor layer 2 to remove the p-type semiconductor layer 2 and the light emitting layer 3 until the n-type contact layer is exposed at the surface.

Then, as illustrated in FIG. 12B, $SiO_2$ forming the dielectric film 11a having a film thickness of 200 nm is formed on the semiconductor layers using a thermal CVD apparatus. By using the thermal CVD apparatus, a film having a good ability to cover steps can be formed, the ability to cover perpendicular cross sections is good, and the dielectric film 11a can be formed.

Continuing as illustrated in FIG. 12C, the n-side electrode 7 having ohmic characteristics is formed. Namely, a not-illustrated patterned lift-off resist is formed on the semiconductor layers and a portion of the $SiO_2$ film on the exposed n-type contact layer is removed by ammonium fluoride processing. The $SiO_2$ film is removed and a vacuum vapor deposition apparatus is used to form the n-side electrode 7 made of, for example, a Ti/Al/Ni/Au film having a film thickness of 500 nm as an ohmic contact region on the exposed n-type contact layer, and sintering is performed at 550° C. in a nitrogen atmosphere.

Then, to form the p-side electrode 4 illustrated in FIG. 13A, a not-illustrated patterned lift-off resist is formed on the semiconductor layers and a portion of the $SiO_2$ film on the p-type contact layer is removed by ammonium fluoride processing. A patterned lift-off resist is then formed on the p-type contact layer; a vacuum vapor deposition apparatus is used to form a Ag film, for example, with a film thickness of 200 nm as the second p-side electrode film 4b; and after lift-off, sintering is performed at 350° C. in a nitrogen atmosphere.

Then, as illustrated in FIG. 13B, a patterned lift-off resist is formed on the semiconductor layers, a Pt/Au film, for example, is formed with a film thickness of 500 nm as the first p-side electrode film 4a in the region in which the Ag film is formed, and the p-side electrode 4 is formed.

Continuing, a not-illustrated patterned lift-off resist is formed on the semiconductor layers, a vacuum vapor deposition apparatus is used to form, for example, five pairs combining a $SiO_2$ film and a $TiO_2$ film for a total of ten layers on the semiconductor layers, and the dielectric stacked film 11 is formed by lift-off. Each of the film thicknesses are λ/(4n), where n is the refractive index of each film and λ is the light emission wavelength of the light emitting layer 3.

Thus, by forming the dielectric stacked film 11, the p-side guide portion 12b for the p-side electrode 4 and the p-side guide portion 12a for the n-side electrode 7 can be formed to be used during mounting.

Thus, in the semiconductor light emitting device 102, the dielectric film 11a formed by, for example, thermal CVD has a better ability than the dielectric stacked film 11 to cover differences in levels and therefore can be formed to cover even steep differences in levels of the semiconductor layer cross sections disposed on either side of the light emitting layer 3. Therefore, it is unnecessary to pattern the differences in levels of the semiconductor layer cross sections disposed on either side of the light emitting layer 3 into a tapered configuration, and simpler and fewer semiconductor layer patterning processes can be used.

Further, by protecting the p-type contact layer and the n-type contact layer from above by the dielectric film 11a prior to forming the n-side electrode 7 and the p-side electrode 4, contamination adhering at the interface between the electrodes and the semiconductor layers during the electrode formation steps can be drastically reduced. Therefore, the reliability, yield, electrical characteristics, and light emission characteristics can be improved.

Forming the dielectric film 11a results in almost no effects on the reflectance of the dielectric stacked film 11 and the dielectric film 11a. Using multiple stacked pairs of dielectrics having different refractive indexes for the dielectric stacked film 11 can provide a sufficiently high design reflectance. In the semiconductor light emitting device 102 of this specific example, the design reflectance of the region in which the dielectric film 11a and the dielectric stacked film 11 are stacked together is 99.5%.

Figure 14:
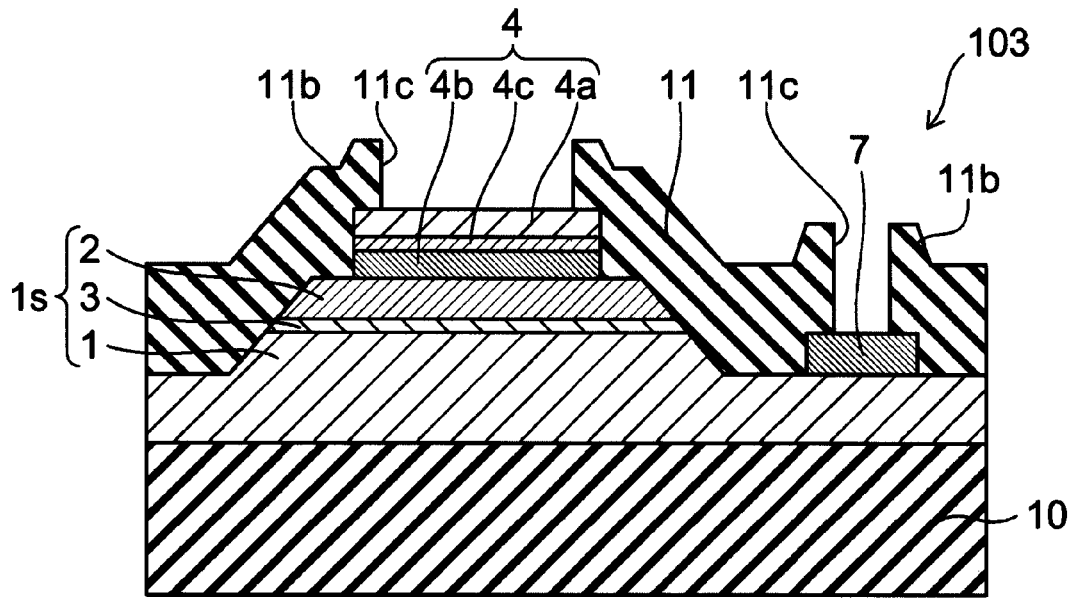
FIG. 14 is a schematic view illustrating the configuration of another semiconductor light emitting device applicable to the manufacturing processes of the semiconductor light emitting apparatus according to the first embodiment of the invention.

FIG. 14 is a schematic view illustrating the configuration of another semiconductor light emitting device applicable to the manufacturing processes of the semiconductor light emitting apparatus according to the first embodiment of the invention.

In another semiconductor light emitting device 103 applicable to the method for manufacturing the semiconductor light emitting apparatus according to this embodiment illustrated in FIG. 14, the p-side electrode 4 includes the first p-side electrode film 4a and the second p-side electrode film 4b provided between the first p-side electrode film 4a and the p-type semiconductor layer 2, and further includes a third p-side electrode film 4c provided between the first p-side electrode film 4a and the second p-side electrode film 4b. Otherwise, the semiconductor light emitting device 103 is similar to the semiconductor light emitting device 101 described above, and a description is omitted.

The third p-side electrode film 4c functions to prevent the materials included in the first p-side electrode film 4a, the solder of the connection member 14 during mounting, and the like from diffusing into the second p-side electrode film 4b, and prevent the materials included in the first p-side electrode film 4a and/or the connection members 14 from reacting with the materials included in the second p-side electrode film 4b. The third p-side electrode film 4c electrically connects to the first p-side electrode film 4a and the second p-side electrode film 4b.

The third p-side electrode film 4c may include a material that does not react with silver or does not actively diffuse into silver.

Materials which may be used as the third p-side electrode film 4c include single-layer films or stacked films of a high melting-point metal usable as the diffusion prevention layer such as, for example, vanadium (V), chrome (Cr), iron (Fe), cobalt (Co), nickel (Ni), niobium (Nb), molybdenum (Mo), ruthenium (Ru), rhodium (Rh), tantalum (Ta), tungsten (W), rhenium (Re), osmium (Os), iridium (Ir), and platinum (Pt).

More favorable metals that have a high work function and easily provide ohmic contact with the p-GaN contact layer to prevent problems even in the case where some diffusion into the second p-side electrode film 4b occurs include iron (Fe), cobalt (Co), nickel (Ni), rhodium (Rh), tungsten (W), rhenium (Re), osmium (Os), iridium (Ir), and platinum (Pt).

In the case where the third p-side electrode film 4c is a single-layer film, it is favorable that the film thickness thereof is in the range of 5 nm to 200 nm to maintain the film state. The film thickness for a stacked film is not particularly limited, and may be, for example, between 10 nm and 10,000 nm.

By providing the third p-side electrode film 4c as a diffusion prevention layer, mounting is possible at higher temperatures. Therefore, the mounting rate can be increased to improve cost competitiveness.

The dielectric film 11a described in regard to the semiconductor light emitting device 102 may be provided in the semiconductor light emitting device 103.

Figure 15:
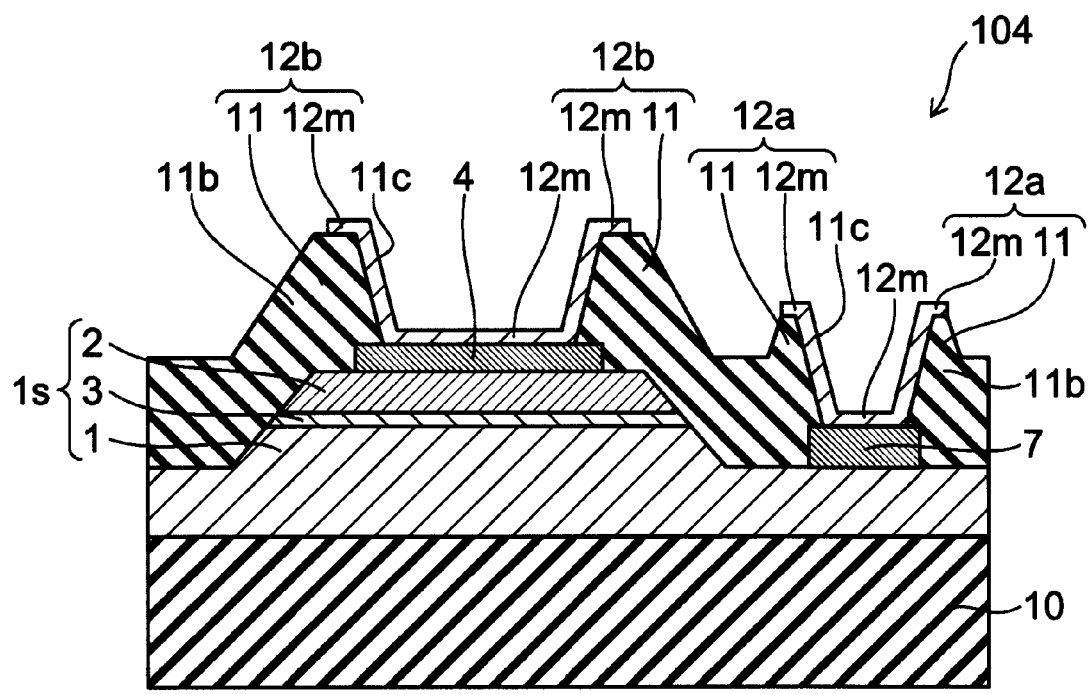
FIG. 15 is a schematic view illustrating the configuration of another semiconductor light emitting device applicable to the manufacturing processes of the semiconductor light emitting apparatus according to the first embodiment of the invention.

FIG. 15 is a schematic view illustrating the configuration of another semiconductor light emitting device applicable to the manufacturing processes of the semiconductor light emitting apparatus according to the first embodiment of the invention.

In another semiconductor light emitting device 104 applicable to the method for manufacturing the semiconductor light emitting apparatus according to this embodiment illustrated in FIG. 15, conductive guide films 12m are provided on the p-side electrode 4 and the n-side electrode 7 not covered by the dielectric stacked film 11, the upper face (on the side of the dielectric stacked film 11 opposite the semiconductor layers) of the dielectric stacked film 11 of the peripheral portions of the p-side electrode 4 and the n-side electrode 7, and on the side faces of the dielectric stacked film 11. Otherwise, the semiconductor light emitting device 104 is similar to the semiconductor light emitting device 101 described above, and a description is omitted.

The n-side guide portion 12a is formed of the dielectric stacked film 11 and the conductive guide film 12m at the peripheral portion of the n-side electrode 7. The p-side guide portion 12b is formed of the dielectric stacked film 11 and the conductive guide film 12m at the peripheral portion of the p-side electrode 4. In other words, the conductive guide films 12m provided on the side faces of the dielectric stacked film 11 define the recesses 11c, and the connection members 14 fit into the recesses 11c to assemble the semiconductor light emitting device 104 and the mounting member 13.

Thus, even in the case where the conductive guide films 12m are provided on portions of the protruding portions of the dielectric stacked film 11, the connection members 14 can be brought into contact and joined with the at least one of the n-side electrode 7 and the p-side electrode 4 using the protruding portions 11b of the dielectric stacked film 11 as guides.

The conductive guide films 12m may be formed by, for example, forming a patterned lift-off resist on the semiconductor layers after forming the dielectric stacked film 11 and forming, for example, a Ti/Pt/Au film with a film thickness of 500 nm as the conductive guide films 12m.

By providing the conductive guide films 12m in the n-side guide portion 12a and the p-side guide portion 12b to cover a portion of the upper face and the side faces of the dielectric stacked film 11, damage of the guide portions due to shocks during contact of the connection members 14 (e.g., the solder) with the n-side guide portion 12a and the p-side guide portion 12b or applied vibrations can be prevented during mounting. In the case of using solder for the connection member 14, the wettability against the solder is improved by providing the conductive guide films 12m as the effective bonding surface area with the solder is increased. Thereby, easiness of mounting process is improved and the mounting speed can be further improved, then a cost competitive edge can be further improved.

It is favorable that the cross section of the dielectric stacked film 11 has a tapered configuration for easy formation of the conductive guide films 12m on the side faces of the dielectric stacked film 11.

By protecting the dielectric stacked film 11 forming the n-side guide portion 12a and the p-side guide portion 12b by the conductive guide films 12m, vibrations under more vigorous conditions can be used, and the semiconductor light emitting device 104 can be moved in a wider range. Therefore, the mounting rate can be increased more to further improve cost competitiveness.

Second Embodiment

Figure 16:
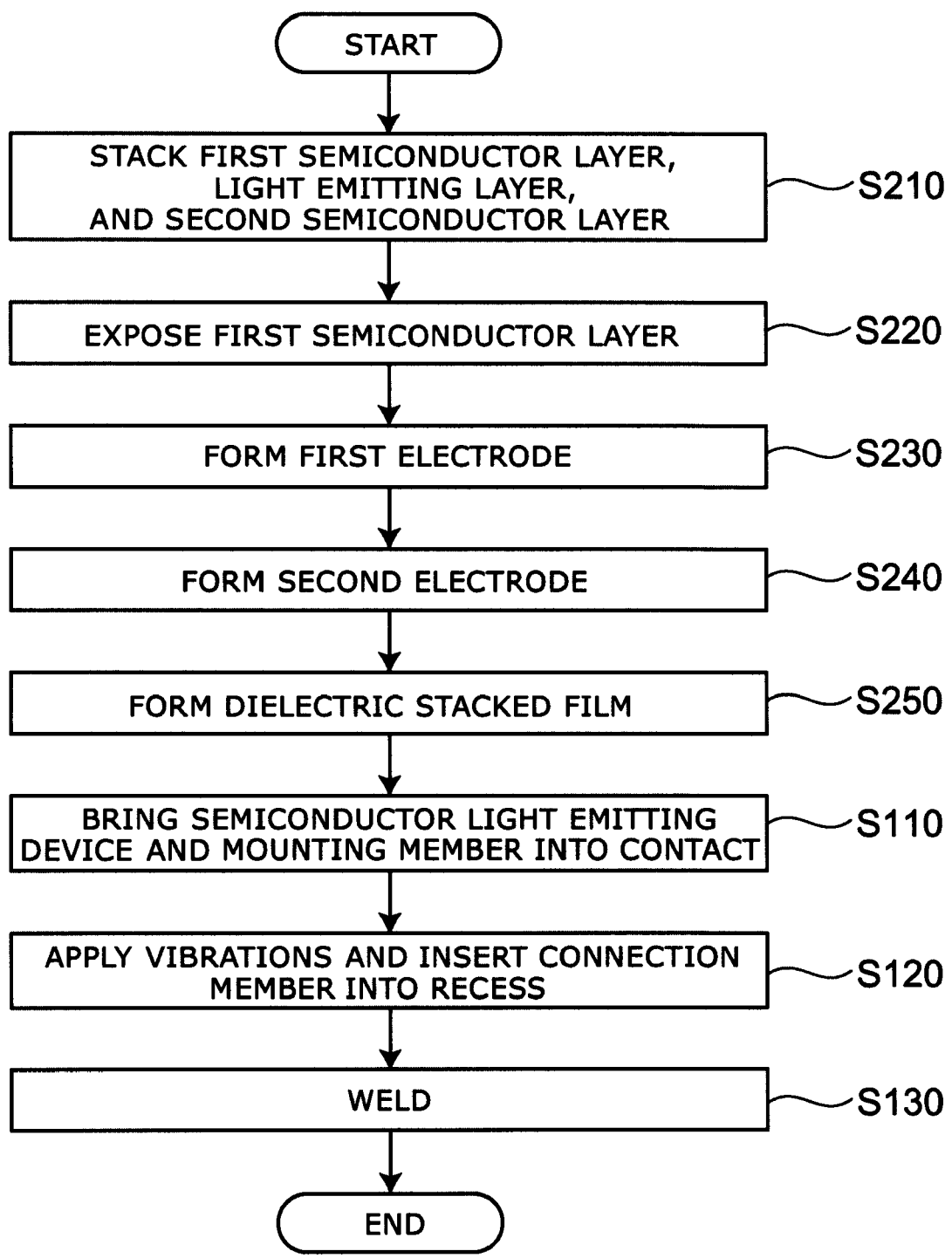
FIG. 16 is a flowchart illustrating the manufacturing processes of a semiconductor light emitting apparatus according to a second embodiment of the invention.

FIG. 16 is a flowchart illustrating the manufacturing processes of a semiconductor light emitting apparatus according to a second embodiment of the invention.

As illustrated in FIG. 16, the method for manufacturing the semiconductor light emitting apparatus according to the second embodiment of the invention further includes the following processes prior to step S110 illustrated in FIG. 4.

Namely, first, the first semiconductor layer (the n-type semiconductor layer 1), the light emitting layer 3, and the second semiconductor layer (the p-type semiconductor layer 2) are stacked on the substrate 10 (step S210).

Then, a portion of the second semiconductor layer and the light emitting layer is removed to expose the first semiconductor layer (step S220).

The first electrode (the n-side electrode 7) is then formed on the exposed first semiconductor layer (step S230).

The second electrode (the p-side electrode 4) is then formed on the second semiconductor layer (step S240).

Multiple types of dielectric films having different refractive indexes are alternately stacked on the exposed first semiconductor layer and the second semiconductor layer not covered by the first electrode and the second electrode to form the dielectric stacked film 11 (step S250).

The methods described in regard to FIGS. 5A to 6C, for example, may be used in step S210 to step S250 recited above.

Thus, according to the method for manufacturing the semiconductor light emitting apparatus according to this embodiment, the dielectric stacked film 11 forming the guide portions is formed; the semiconductor light emitting device and the mounting member 13 can be assembled utilizing the guide portions; high-precision and high-speed assembly is possible; and a semiconductor light emitting apparatus having high light extraction efficiency can be provided.

Steps S210 to S250 recited above are interchangeable within the extent of technical feasibility and may be implemented simultaneously. For example, steps S230 and S240 which form the n-side electrode 7 and the p-side electrode 4 are interchangeable and may be implemented simultaneously.

Third Embodiment

Figure 17:
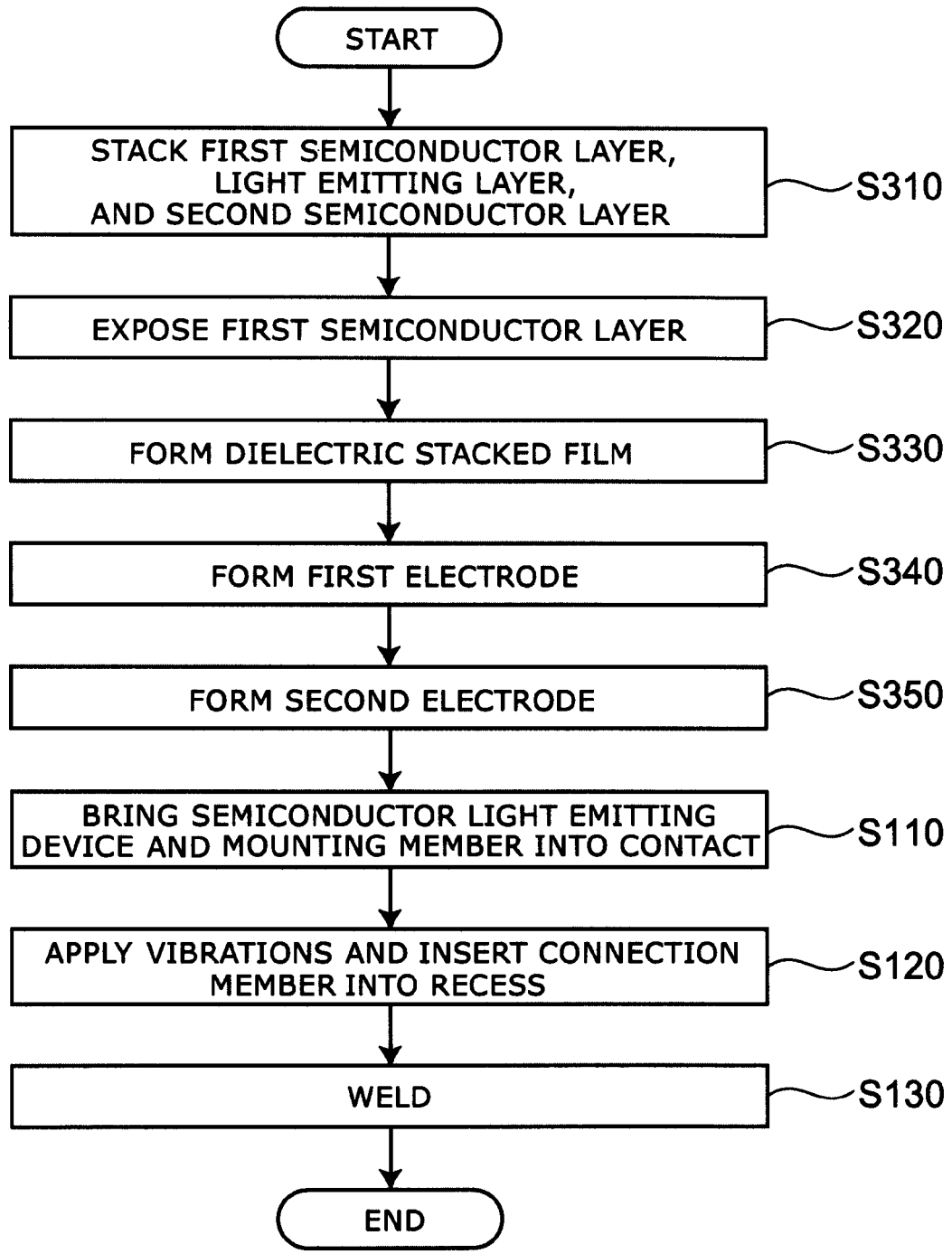
FIG. 17 is a flowchart illustrating the manufacturing processes of a semiconductor light emitting apparatus according to a third embodiment of the invention.

FIG. 17 is a flowchart illustrating the manufacturing processes of a semiconductor light emitting apparatus according to a third embodiment of the invention.

As illustrated in FIG. 17, the method for manufacturing the semiconductor light emitting apparatus according to the third embodiment of the invention further includes the following processes prior to step S110 illustrated in FIG. 4.

Namely, the first semiconductor layer (the n-type semiconductor layer 1), the light emitting layer 3, and the second semiconductor layer (the p-type semiconductor layer 2) are stacked on the substrate 10 (step S310).

Then, a portion of the second semiconductor layer and a portion of the light emitting layer are removed to expose the first semiconductor layer (step S320).

Dielectric films having different refractive indexes are then alternately stacked on a portion of the exposed first semiconductor layer and a portion of the second semiconductor layer to form the dielectric stacked film 11 (step S330).

The first electrode (the n-side electrode 7) is then formed on the first semiconductor layer not covered by the dielectric stacked film 11 (step S340).

The second electrode (the p-side electrode 4) is then formed on the second semiconductor layer not covered by the dielectric stacked film 11 (step S350).

The methods described in regard to FIGS. 5A to 6C, for example, may be modified and used in step S310 to step S350 recited above.

Fourth Embodiment

Figure 18:
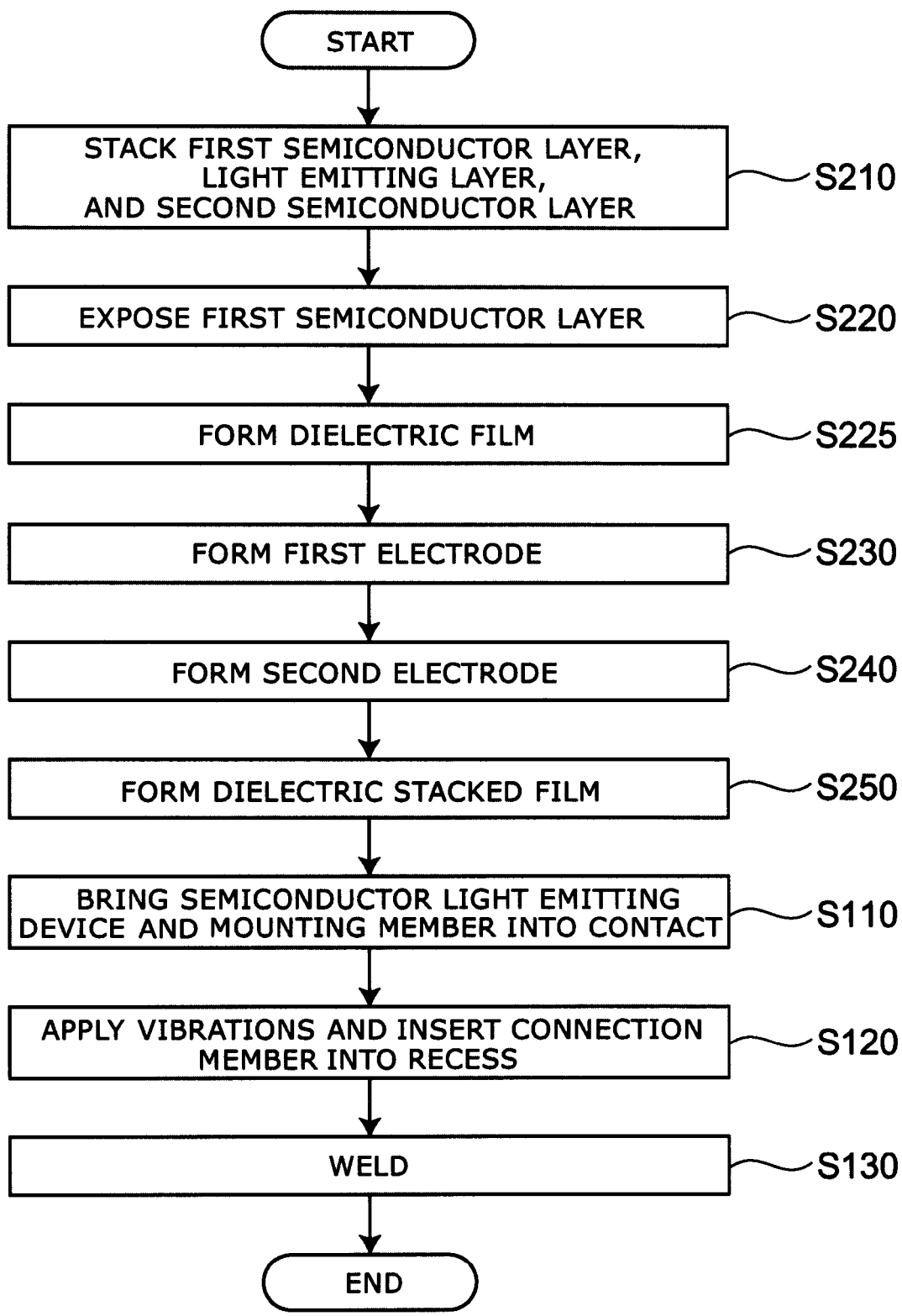
FIG. 18 is a flowchart illustrating the manufacturing processes of a semiconductor light emitting apparatus according to a fourth embodiment of the invention.

FIG. 18 is a flowchart illustrating the manufacturing processes of a semiconductor light emitting apparatus according to a fourth embodiment of the invention.

As illustrated in FIG. 18, the dielectric film 11a described above is provided in the method for manufacturing the semiconductor light emitting apparatus according to the fourth embodiment of the invention after exposing the first semiconductor layer and prior to forming the dielectric stacked film 11.

Namely, as illustrated in FIG. 18, the dielectric film 11a, having a better ability than the dielectric stacked film 11 to cover the first semiconductor layer and the second semiconductor layer, is formed on a portion of the uncovered first semiconductor layer and a portion of the second semiconductor layer (step S225) between the process that exposes the first semiconductor layer (step S220) and the process that forms the dielectric stacked film (step S250).

In this specific example, step S225 is implemented between the process that exposes the first semiconductor layer (step S220) and the process that forms the first electrode (step S230). In such a case, the order of step S230 to step S250 is interchangeable, and the processes can be implemented simultaneously.

The methods described in regard to FIG. 12A to FIG. 13C, for example, may be used in step S210 to step S250 recited above.

Fifth Embodiment

Figure 19:
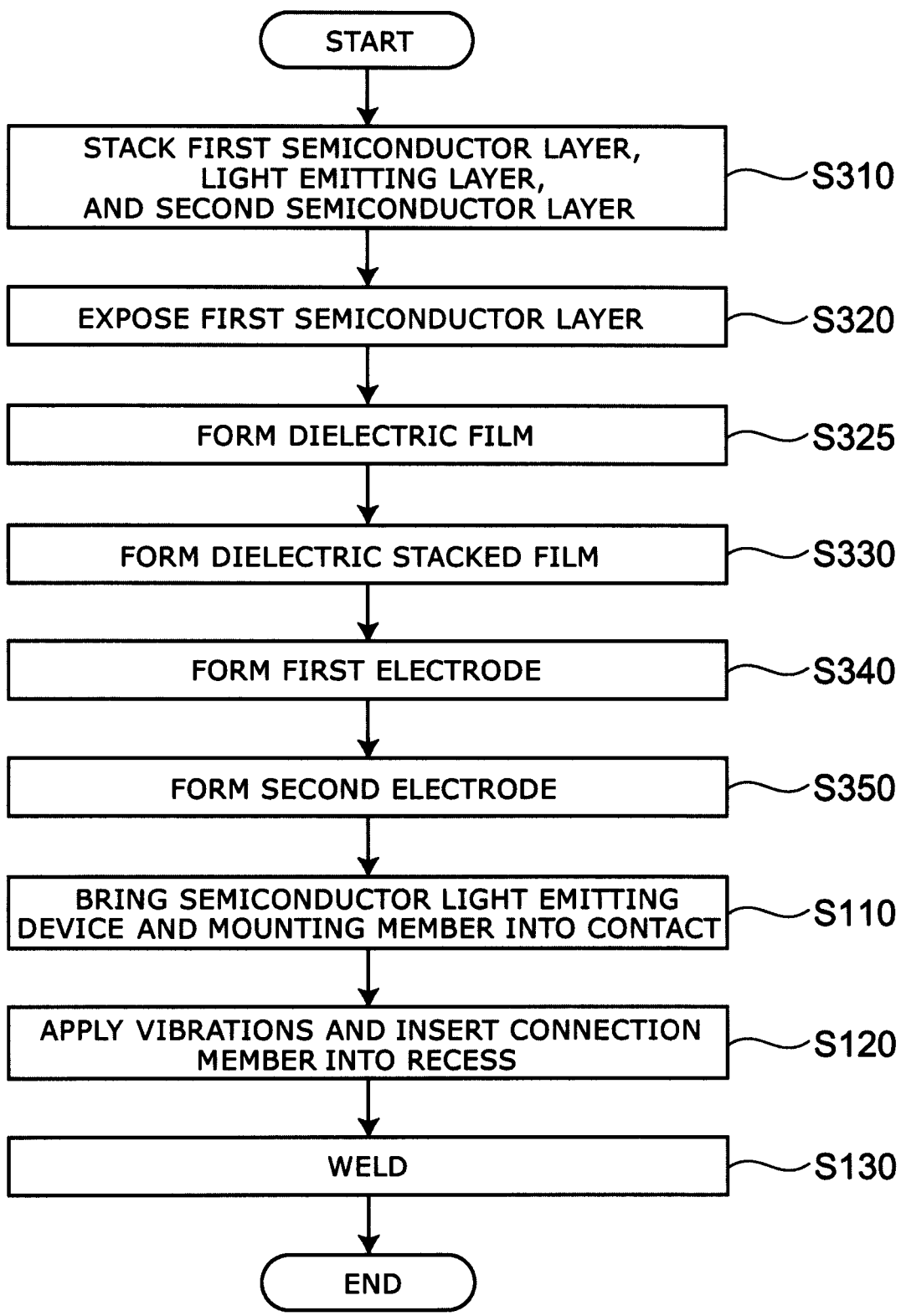
FIG. 19 is a flowchart illustrating the manufacturing processes of a semiconductor light emitting apparatus according to a fifth embodiment of the invention.

FIG. 19 is a flowchart illustrating the manufacturing processes of a semiconductor light emitting apparatus according to a fifth embodiment of the invention.

As illustrated in FIG. 19, the dielectric film 11a described above is provided by the method for manufacturing the semiconductor light emitting apparatus according to the fifth embodiment of the invention after exposing the first semiconductor layer and prior to forming the dielectric stacked film 11.

Namely, as illustrated in FIG. 19, the dielectric film 11a, having a better ability than the dielectric stacked film 11 to cover the first semiconductor layer and the second semiconductor layer, is formed on a portion of the exposed first semiconductor layer and a portion of the second semiconductor layer (step S325) between the process that exposes the first semiconductor layer (step S320) and the process that forms the dielectric stacked film (step S330).

The order of step S330 to step S350 recited above is interchangeable, and the processes may be implemented simultaneously.

In the methods for manufacturing the semiconductor light emitting apparatus according to the third to fifth embodiments recited above, the dielectric stacked film 11 including the protruding portions 11b forming the guide portions are formed; the semiconductor light emitting device and the mounting member 13 can be assembled utilizing the guide portions; high-precision and high-speed assembly is possible; and a semiconductor light emitting apparatus having high light extraction efficiency can be provided.

In the method for manufacturing the semiconductor light emitting apparatus according to the second to fifth embodiments recited above, the process that exposes the first semiconductor layer (step S220 or step S320) may include forming the tapered portion it on the stacked structure unit 1s to incline with respect to the layer surface of the stacked structure unit 1s. Thereby, the covering of the dielectric stacked film 11 formed thereon improves, the reflecting abilities of the dielectric stacked film 11 can be improved by the difference in levels, and a semiconductor light emitting apparatus having high light extraction efficiency can be provided.

The methods for manufacturing the semiconductor light emitting apparatus according to the first to fifth embodiments further include a process that forms the connection member 14 on a mounting substrate, the connection member 14 having a configuration in the plane parallel to the surface of the mounting substrate smaller than a configuration of the at least one of the n-side electrode 7 and the p-side electrode 4 surrounded by the protruding portion 11b. Thereby, the connection member 14 of the prescribed configuration can be formed, and the semiconductor light emitting device and the mounting member 13 can be assembled with high precision. At this time, the height of the connection member 14 is higher than the height of the protruding portion 11b.

Figure 20:
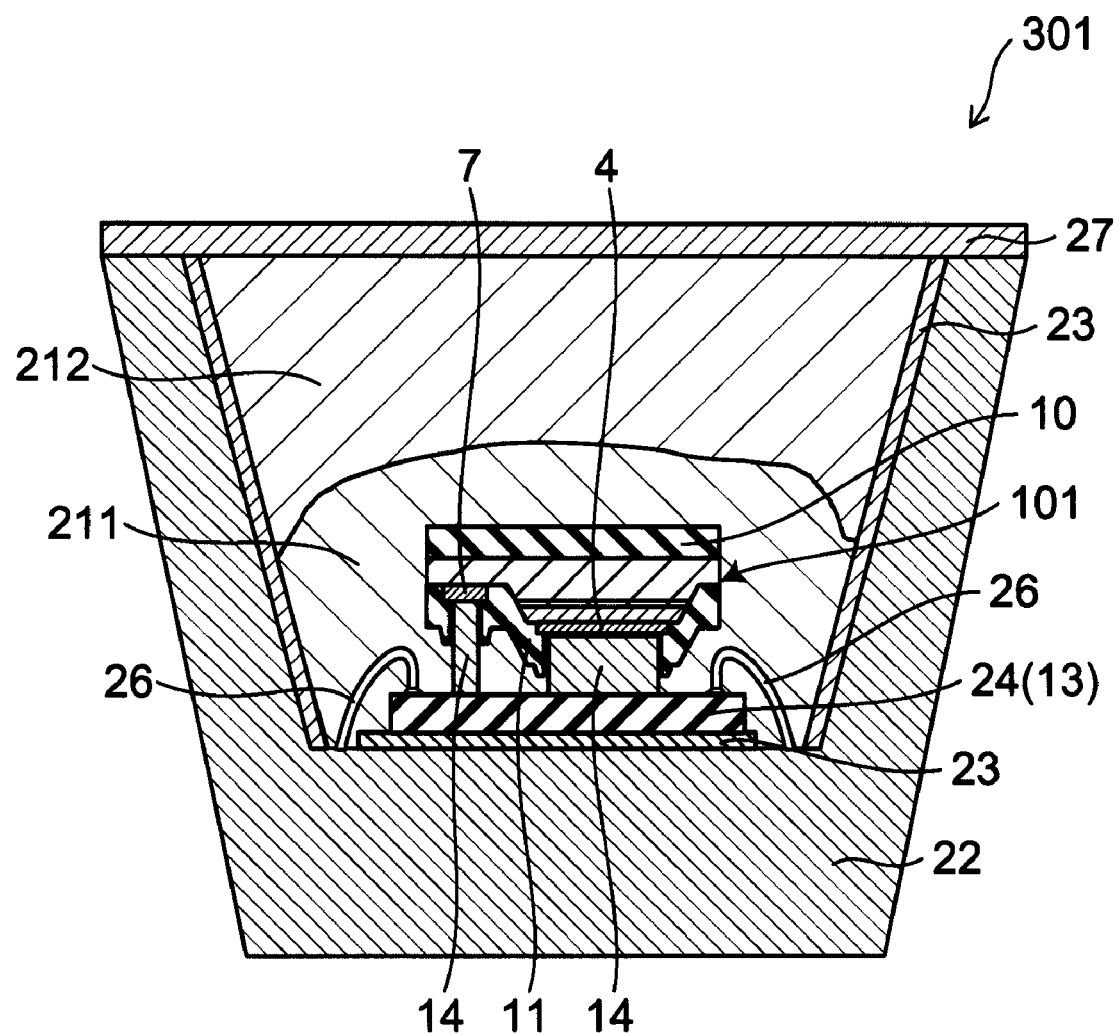
FIG. 20 is a schematic cross-sectional view illustrating the structure of another semiconductor light emitting apparatus manufactured by the method for manufacturing the semiconductor light emitting apparatus according to the embodiments of the invention.

FIG. 20 is a schematic cross-sectional view illustrating the structure of another semiconductor light emitting apparatus manufactured by the method for manufacturing the semiconductor light emitting apparatus according to the embodiments of the invention.

A semiconductor light emitting apparatus 301 of this specific example is a white LED combining any of the semiconductor light emitting devices according to the embodiments recited above and a fluorescent material. That is, the semiconductor light emitting apparatus 301 according to this embodiment includes any of the semiconductor light emitting devices recited above and a fluorescent material layer irradiated by light emitted by the semiconductor light emitting device.

The following description assumes the semiconductor light emitting device 101 recited above combined with a fluorescent material.

In the semiconductor light emitting apparatus 301 according to this embodiment illustrated in FIG. 20, reflecting films 23 are provided on inner faces of a container 22 made of ceramic and the like. The reflecting films 23 are provided separately on an inner side face and a bottom face of the container 22. The reflecting film 23 is made of, for example, aluminum and the like. The semiconductor light emitting device 101 is disposed on the reflecting film 23 provided on the bottom portion of the container 22 via a submount 24. The submount 24 is the mounting member 13.

As described above, the semiconductor light emitting device 101 and the submount 24 (the mounting member 13) are connected and fixed by the connection members 14 (e.g., solder).

Bonding by a bonding agent, solder, etc., may be used to fix the semiconductor light emitting device 101, the submount 24, and the reflecting film 23.

Patterned electrodes are formed on the surface of the submount 24 on the semiconductor light emitting device side to insulate the p-side electrode 4 and the n-side electrode 7 of the semiconductor light emitting device 101. Each of the electrodes is connected to a not-illustrated electrode provided on the container 22 by bonding wires 26. The connection is made to the portion between the reflecting film 23 of the inner side face and the reflecting film 23 of the bottom face.

A first fluorescent material layer 211 including a red fluorescent material is provided to cover the semiconductor light emitting device 101 and the bonding wire 26. A second fluorescent material layer 212 including a blue, green, or yellow fluorescent material is formed on the first fluorescent material layer 211. A lid 27 made of silicon resin is provided on the fluorescent material layer.

The first fluorescent material layer 211 includes a resin and the red fluorescent material dispersed in the resin.

The red fluorescent material may include, for example, an activating substance of trivalent Eu ($Eu^{3+}$) in a main material such as $Y_2O_3$, $YVO_4$, or $Y_2(P, V)O_4$. In other words, $Y_2O_3$:$Eu^{3+}$, $YVO_4$:$Eu^{3+}$, and the like may be used as the red fluorescent material. The molar concentration of $Eu^{3+}$ may be 1% to 10%. LaOS, $Y_2(P, V)O_4$, and the like may be used as the main material of the red fluorescent material in addition to $Y_2O_3$ and $YVO_4$. $Mn^{4+}$ and the like may be used in addition to $Eu^{3+}$. In particular, absorption at 380 nm increases by adding a small amount of Bi with trivalent Eu to the $YVO_4$ base material. Therefore, the luminous efficiency increases even more. A silicon resin and the like, for example, may be used as the resin.

The second fluorescent material layer 212 includes a resin and at least one of a blue fluorescent material, a green fluorescent material, and a yellow fluorescent material dispersed in the resin. For example, a fluorescent material combining a blue fluorescent material and a green fluorescent material, a fluorescent material combining a blue fluorescent material and a yellow fluorescent material, or a fluorescent material combining a blue fluorescent material, a green fluorescent material, and a yellow fluorescent material may be used.

$(Sr, Ca)_{10}(PO_4)_6Cl_2$:$Eu^{2+}$, $BaMg_2Al_{16}O_{27}$:$Eu^{2+}$, and the like, for example, may be used as the blue fluorescent material.

$Y_2SiO_5$:$Ce^{3+}$, $Tb^{3+}$ having centers of light emission of trivalent Tb, for example, may be used as the green fluorescent material. In such a case, energy is transmitted from Ce ions to Tb ions to improve the excitation efficiency. $Sr_4Al_{14}O_{25}$:$Eu^{2+}$ and the like, for example, may be used as the green fluorescent material.

$Y_3Al_5$:$Ce^{3+}$ and the like, for example, may be used as the yellow fluorescent material.

A silicon resin and the like, for example, may be used as the resin.

In particular, trivalent Tb has a sharp light emission around 550 nm at which visibility is at a maximum and thereby markedly improves the luminous efficiency when combined with the sharp red light emission of trivalent Eu.

According to the semiconductor light emitting apparatus 301 according to this embodiment, ultraviolet light of 380 nm emitted by the semiconductor light emitting device 101 is radiated to the substrate 10 side of the semiconductor light emitting device 101 and efficiently excites the fluorescent materials recited above included in the fluorescent material layers by utilizing reflections of the reflecting films 23.

For example, the fluorescent material recited above having centers of light emission of trivalent Eu and the like included in the first fluorescent material layer 211 converts light into light having a narrow wavelength distribution around 620 nm to efficiently produce red visible light.

The blue, green, and yellow fluorescent materials included in the second fluorescent material layer 212 are efficiently excited and efficiently produce blue, green, and yellow visible light.

Mixing such colors produces white light and light of other various colors with high efficiency and good color rendition.

The method for manufacturing the semiconductor light emitting apparatus 301 according to this embodiment will now be described.

The methods described above may be used in the processes that fabricate the semiconductor light emitting device 101. Therefore, the processes after completion of the semiconductor light emitting device 101 will now be described.

First, a metal film forming the reflecting film 23 is formed on the inner face of the container 22 by, for example, sputtering. The metal film is patterned, and the reflecting film 23 is left on each of the inner side face and the bottom face of the container 22.

Then, the methods described in regard to the first embodiment are used to fix the semiconductor light emitting device 101 on the submount 24 (the mounting member 13). The submount 24 is disposed and fixed on the reflecting film 23 on the bottom face of the container 22. Bonding using a bonding agent, solder, etc., may be used for the fixation.

Continuing, each of a not-illustrated n-side electrode and p-side electrode on the submount 24 is connected to a not-illustrated electrode provided on the container 22 by bonding wires 26.

The first fluorescent material layer 211 including the red fluorescent material is then formed to cover the semiconductor light emitting device 101 and the bonding wires 26. The second fluorescent material layer 212 including the blue, the green, or the yellow fluorescent material is formed on the first fluorescent material layer 211.

The method for forming each of the fluorescent material layers may drop resin/source material mixture solutions having the fluorescent materials dispersed therein and perform heat treatment to cure the resin by thermal polymerization. It is possible to cause the fine particles of the fluorescent materials to distribute unevenly in the lower layers of the first and second fluorescent material layers 211 and 212 to appropriately control the luminous efficacy of each of the fluorescent materials by allowing the resin/source material mixture solutions including the fluorescent materials to lie for a while after dropping and prior to curing to allow the fine particles of the fluorescent materials to settle. Subsequently, the lid 27 is provided on the fluorescent material layer, and the semiconductor light emitting apparatus 301 according to this embodiment, that is, the white LED, is fabricated.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, $x+y+z \leq 1$) for which each of the composition ratios x, y, and z are changed within the ranges. "Nitride semiconductor" further includes group V elements other than N (nitrogen) in the chemical formula recited above and any of various dopants added to control the conductivity type, etc.

Hereinabove, exemplary embodiments of the invention are described with reference to specific examples. However, the invention is not limited to these specific examples. For example, one skilled in the art may appropriately select configurations, sizes, material qualities, arrangements, etc., of components of semiconductor multi-layer films, metal films, dielectric films, etc., of semiconductor light emitting devices or manufacturing methods from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all methods for manufacturing semiconductor light emitting apparatuses and semiconductor light emitting apparatuses obtainable by an appropriate design modification by one skilled in the art based on methods for manufacturing the semiconductor light emitting apparatuses and the semiconductor light emitting apparatuses described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A semiconductor light emitting apparatus, comprising:
   a semiconductor light emitting device;
   a mounting member; and
   a connection member,
   the semiconductor light emitting device including:
      a stacked structure unit including a first semiconductor layer, a second semiconductor layer, and a light emitting layer provided between the first semiconductor layer and the second semiconductor layer;
      a first electrode provided on a major surface of the stacked structure unit to connect to the first semiconductor layer;
      a second electrode provided on the major surface of the stacked structure unit to connect to the second semiconductor layer; and
      a dielectric stacked film provided on the first semiconductor layer and the second semiconductor layer of the major surface not covered by the first electrode and the second electrode, formed of stacked dielectric films having different refractive indexes, and including a protruding portion erected on a rim of at least one of the first and second electrodes; and
      a conductive guide film provided on at least one of a first position on the first electrode not covered by the dielectric stacked film, a second position on the second electrode not covered by the dielectric stacked film, a third position on a first upper face of the dielectric stacked film on a peripheral portion of the first electrode, a fourth position on a second upper face of the dielectric stacked film on a peripheral portion of the second electrode, and a fifth position on a side faces of the dielectric stacked film,
   the mounting member being provided to face the major surface of the semiconductor light emitting device, and
   the connection member being provided between the semiconductor light emitting device and the mounting member, the connection member connecting the first electrode with the mounting member and connecting the second electrode with the mounting member, the connection member being welded to the at least one of the first electrode and the second electrode and covering a portion of the protruding portion.

2. The apparatus according to claim 1, wherein a height of the connection member is higher than a height of the protruding portion.

3. The apparatus according to claim 1, wherein the dielectric stacked film covers an end of at least one of the first electrode and the second electrode.

4. The apparatus according to claim 1, wherein the dielectric stacked film reflects light emitted by the light emitting layer.

5. The apparatus according to claim 1, wherein the dielectric stacked film includes a plurality of first dielectric layers having a first refractive index alternately stacked with a plurality of second dielectric layers having a second refractive index different from the first refractive index, a thickness of the first dielectric layer being $\lambda/(4n_1)$ and a thickness of the second dielectric layer being $\lambda/(4n_2)$, where $n_1$ is the first refractive index, $n_2$ is the second refractive index, and $\lambda$ is a light emission wavelength of the light emitting layer.

6. The apparatus according to claim 1, wherein the connection member includes solder.

* * * * *